(12) United States Patent
Dainese et al.

(10) Patent No.: US 10,177,248 B2
(45) Date of Patent: Jan. 8, 2019

(54) SEMICONDUCTOR DEVICE

(71) Applicant: Infineon Technologies Austria AG, Villach (DE)

(72) Inventors: Matteo Dainese, Villach (AT); Erich Griebl, Dorfen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/706,263

(22) Filed: Sep. 15, 2017

(65) Prior Publication Data

US 2018/0083132 A1  Mar. 22, 2018

(30) Foreign Application Priority Data

Sep. 16, 2016  (DE) .................. 10 2016 117 511

(51) Int. Cl.

| H01L 29/74 | (2006.01) |
|---|---|
| H01L 31/111 | (2006.01) |
| H01L 29/739 | (2006.01) |
| H01L 21/027 | (2006.01) |
| H01L 21/265 | (2006.01) |
| H01L 21/266 | (2006.01) |

(Continued)

(52) U.S. Cl.
CPC ...... *H01L 29/7397* (2013.01); *H01L 21/0273* (2013.01); *H01L 21/266* (2013.01); *H01L 21/26513* (2013.01); *H01L 21/3086* (2013.01); *H01L 29/0615* (2013.01); *H01L 29/0684* (2013.01); *H01L 29/0804* (2013.01); *H01L 29/0821* (2013.01); *H01L 29/1004* (2013.01); *H01L 29/1095* (2013.01); *H01L 29/36* (2013.01); *H01L 29/41708* (2013.01); *H01L 29/4236* (2013.01); *H01L 29/66348* (2013.01)

(58) Field of Classification Search
CPC ............ H01L 29/7397; H01L 29/1095; H01L 29/0696; H01L 29/4236; H01L 29/0804
USPC ....................................... 257/139
See application file for complete search history.

(56) References Cited

U.S. PATENT DOCUMENTS

| 2013/0037853 A1* | 2/2013 | Onozawa ............ H01L 29/0661 257/139 |
|---|---|---|
| 2013/0256744 A1* | 10/2013 | Tang ................... H01L 29/7397 257/139 |

(Continued)

*Primary Examiner* — Theresa T Doan
(74) *Attorney, Agent, or Firm* — Murphy, Bilak & Homiller, PLLC

(57) ABSTRACT

A semiconductor device includes a semiconductor body including a base region and two semiconductor mesas separated from each other by an insulated trench gate structure extending from a first side into the base region, and including a dielectric layer separating a gate electrode from the semiconductor body. Each semiconductor mesa includes, in a cross-section perpendicular to the first side, a body region forming a pn-junction with the base region, a latch-up-safety region of the same conductivity type as the body region arranged between the body region and the first side, and having a higher doping concentration than the body region, and an emitter region between the dielectric layer and the latch-up-safety region and forming a pn-junction with the body region. At least one semiconductor mesa includes an emitter contact arranged between the emitter region and the latch-up-safety region and forming with the latch-up-safety and emitter regions an Ohmic contact.

15 Claims, 16 Drawing Sheets

(51) Int. Cl.
*H01L 21/308* (2006.01)
*H01L 29/06* (2006.01)
*H01L 29/08* (2006.01)
*H01L 29/10* (2006.01)
*H01L 29/36* (2006.01)
*H01L 29/417* (2006.01)
*H01L 29/423* (2006.01)
*H01L 29/66* (2006.01)

(56) References Cited

U.S. PATENT DOCUMENTS

2014/0084359 A1 3/2014 Tsuchiya et al.
2015/0236144 A1 8/2015 Matsuura
2015/0279985 A1 10/2015 Philippou et al.
2015/0340480 A1 11/2015 Matsuura \* cited by examiner

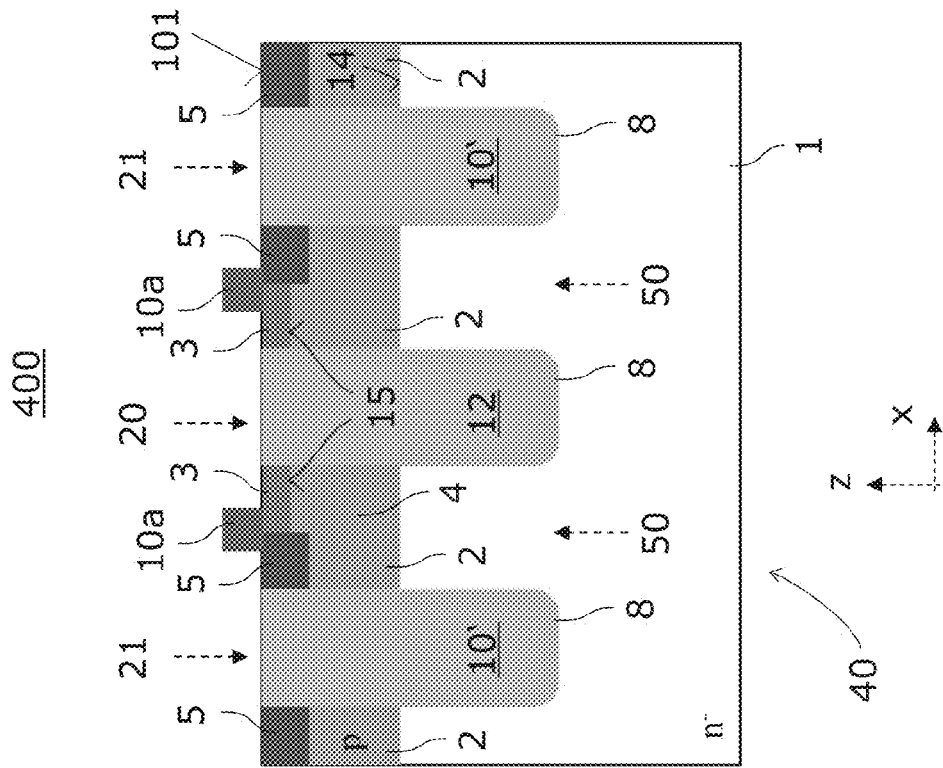
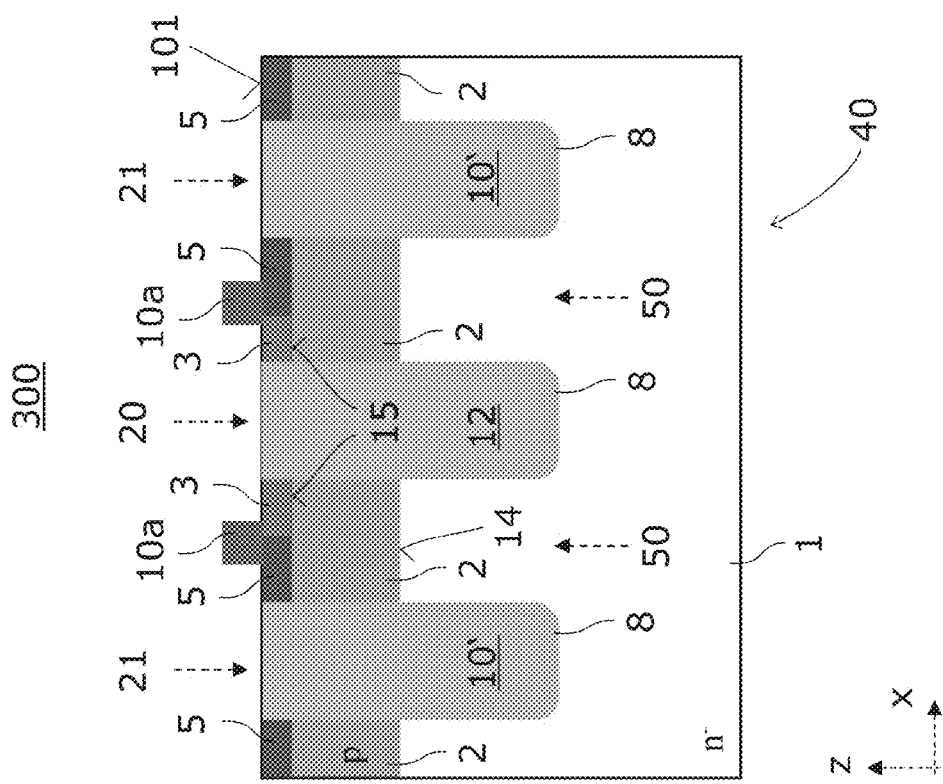
FIG 6A
FIG 6B

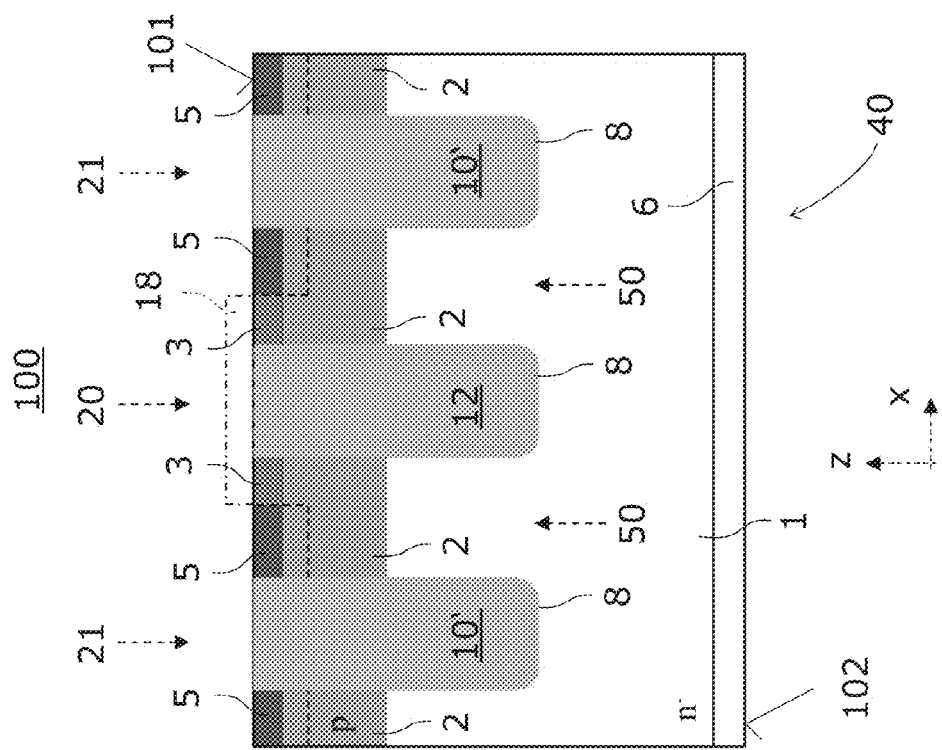
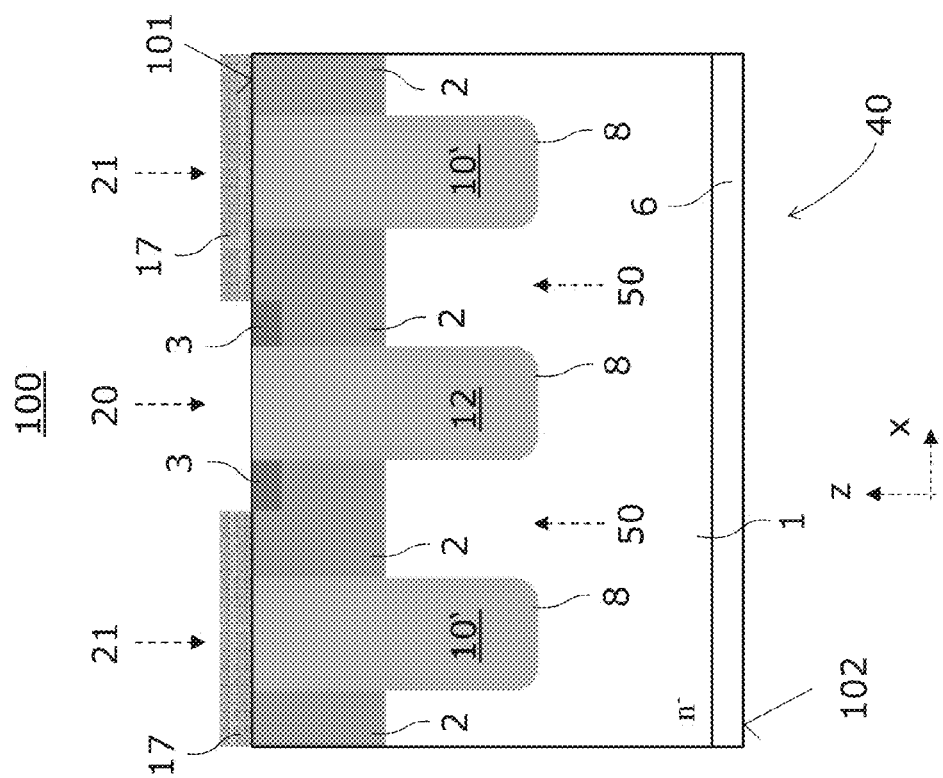

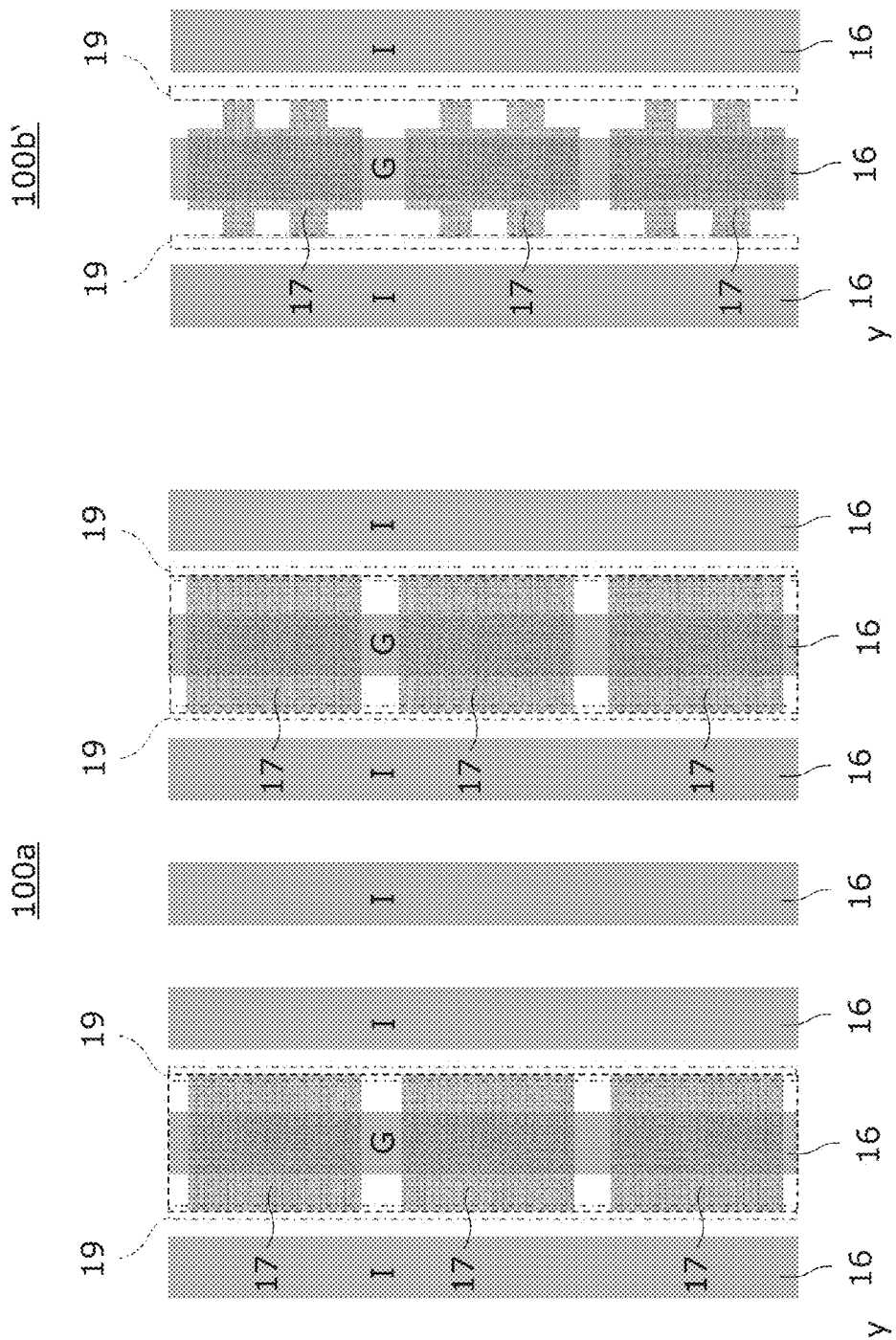

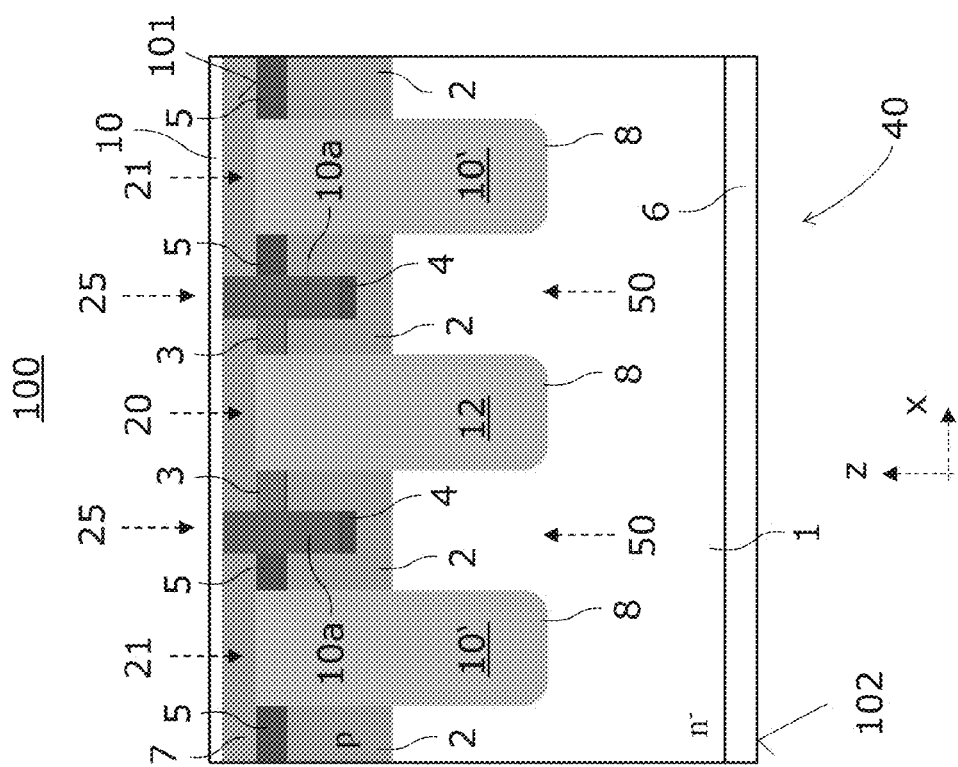
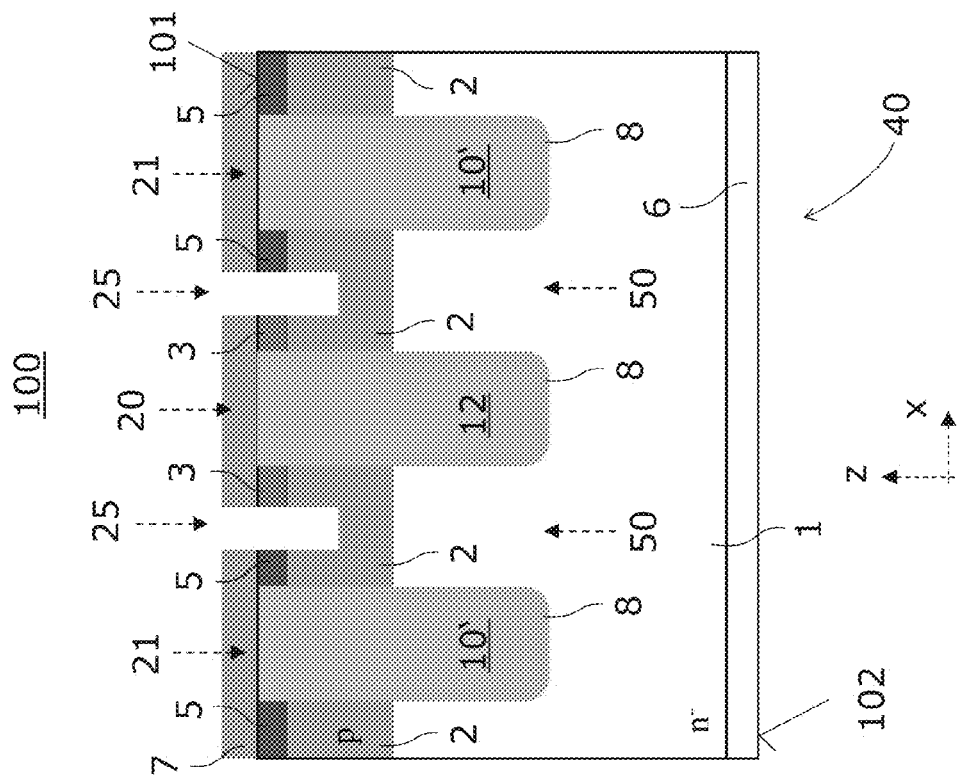

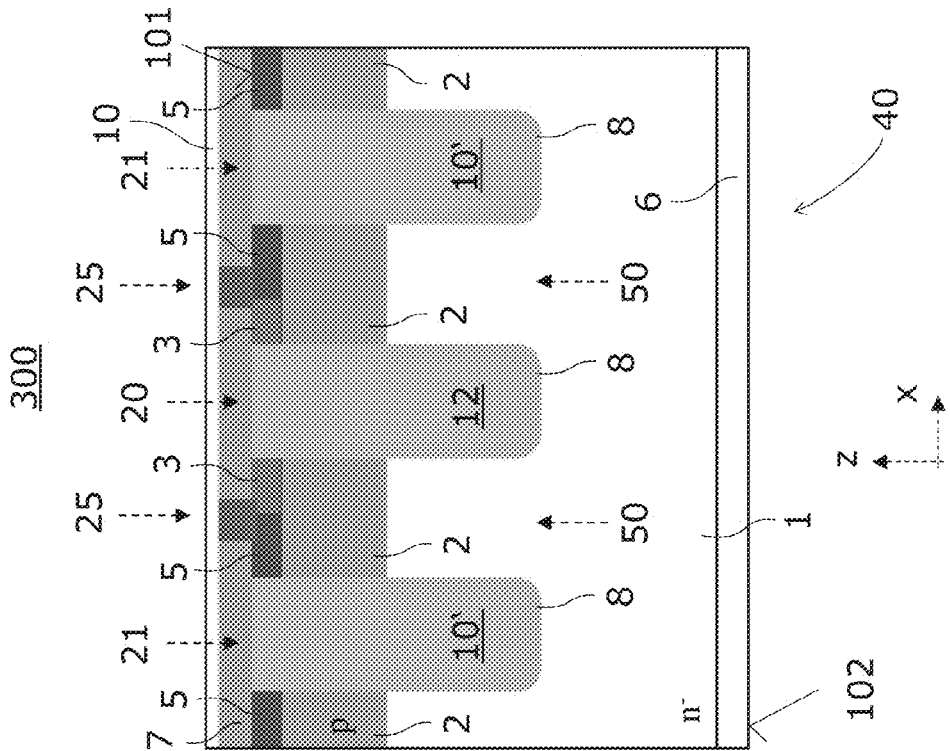
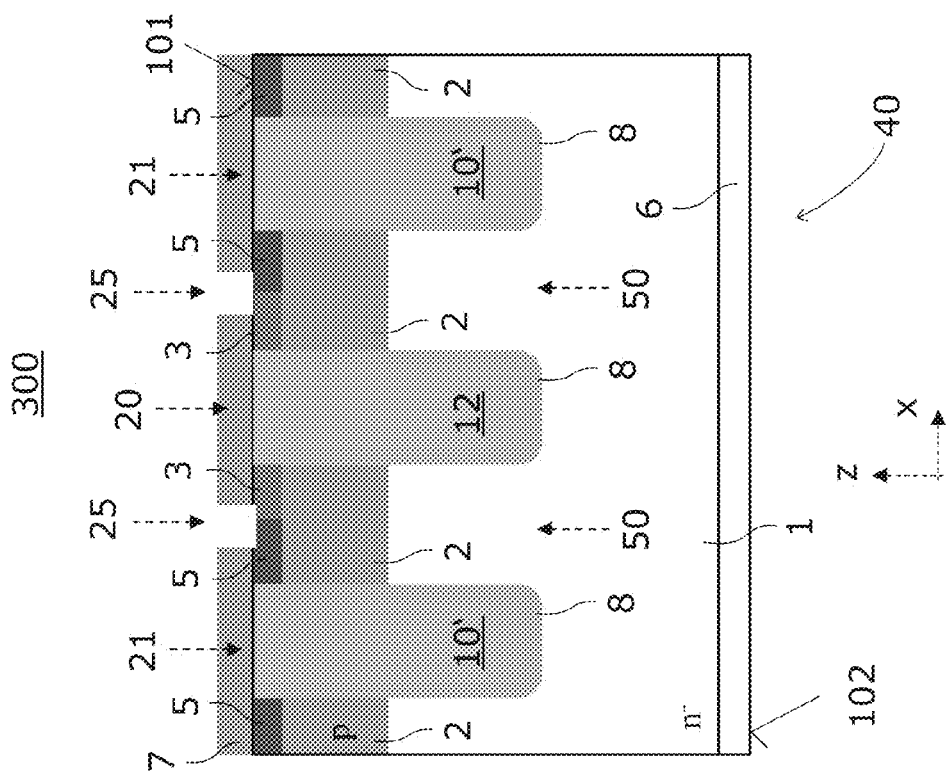

SEMICONDUCTOR DEVICE

TECHNICAL FIELD

Embodiments of the present invention relate to semiconductor devices, in particular to bipolar semiconductor devices, and to manufacturing methods therefor.

BACKGROUND

Many functions of modern devices in automotive, consumer and industrial applications, such as converting electrical energy and driving an electric motor or an electric machine, rely on semiconductor devices such as such as Metal Oxide Semiconductor Field Effect Transistors (MOSFETs) and Insulated Gate Bipolar Transistors (IGBTs).

In an IGBT, an isolated gate FET (Field Effect Transistor) is used for control of a bipolar transistor. In so doing, the low on-resistance $R_{on}$ and the fast voltage control of the isolated gate FET is combined in a single semiconductor device with the high current and low saturation voltage (VCEsat) of the bipolar transistor. Accordingly, IGBTs are widely used in medium to high-power applications such as switching mode power supplies, inverters and traction motor controls. A single power IGBT may have a current switching capability of up to about 100 A or more and may withstand blocking voltages of up to 6 kV or even more.

Typically, a high ruggedness against latch-up, i.e. against a failure mode in which the IGBT can no longer be turned off by the isolated gate, is often desired. Depending on design, even a small defect density during manufacturing may result in lowering the ruggedness against latch-up of the manufactured IGBTs.

Accordingly, there is a need to improve manufacturing of bipolar semiconductor devices.

SUMMARY

According to an embodiment of a semiconductor device, the semiconductor device includes a semiconductor body having a first side. The semiconductor body includes a base region of a first conductivity type, and two semiconductor mesas which are separated from each other by an insulated trench gate electrode structure extending from the first side into the base region. The insulated trench gate electrode structure includes a gate electrode and a dielectric layer separating the gate electrode from the semiconductor body. Each of the two semiconductor mesas includes, in a cross-section perpendicular to the first side, a body region of a second conductivity type forming a first pn-junction with the base region, a latch-up-safety region of the second conductivity type arranged between the body region and the first side, and having a higher doping concentration than the body region, and an emitter region of the first conductivity type arranged at the dielectric layer and between the dielectric layer and the latch-up-safety region, and forming a second pn-junction with the body region. At least one of the two semiconductor mesas includes an emitter contact forming with the latch-up-safety region and the emitter region a respective Ohmic contact in the cross-section.

According to an embodiment of a semiconductor device, the semiconductor device includes a semiconductor body having a first side. The semiconductor body includes a base region of a first conductivity type, a semiconductor mesa formed between two trenches each of which extends from the first side into the base region, a body region of a second conductivity type arranged in the semiconductor mesa and forming a first pn-junction with the base region an emitter region of the first conductivity type forming a second pn-junction with the body region in the semiconductor mesa, and a latch-up-safety region of the second conductivity type arranged between the first pn-junction and the first side and having a higher doping concentration than the body region. An emitter contact forms with each of the latch-up-safety region and the emitter region a respective Ohmic contact.

According to an embodiment of method for forming a semiconductor device, the method includes providing a wafer structure having a first side, and including a base layer of a first conductivity type, a body layer of a second conductivity type forming a first pn-junction with the base layer, deep trenches extending from the first side through the first pn-junction. Each of the deep trenches includes a conductive region and a dielectric layer separating the conductive region from the base layer and the body layer. Two emitter regions of the first conductivity type and two latch-up-safety regions of the second conductivity type are formed in the body layer, so that, in a cross-section perpendicular to the first side, a first deep trench of the deep trenches is arranged between the two emitter regions, each of which adjoins the dielectric layer of the first deep trench and is arranged between one of the two latch-up-safety regions and the dielectric layer of the first deep trench. Two emitter contacts are formed so that each of the two emitter contacts adjoins one of the two emitter regions and one of the two latch-up-safety regions.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 6A illustrates a vertical cross-section through a semiconductor device according to an embodiment;

FIG. 6B illustrates a vertical cross-section through a semiconductor device according to an embodiment;

FIG. 12A to 15B illustrate vertical cross sections of a wafer during method steps of a method for forming a semiconductor device, and top views of masks used for method steps respectively, according to embodiments; and FIG. 16A to 16B illustrate vertical cross sections of a wafer during method steps of a method for forming a semiconductor device.

DETAILED DESCRIPTION

Figure 1A:
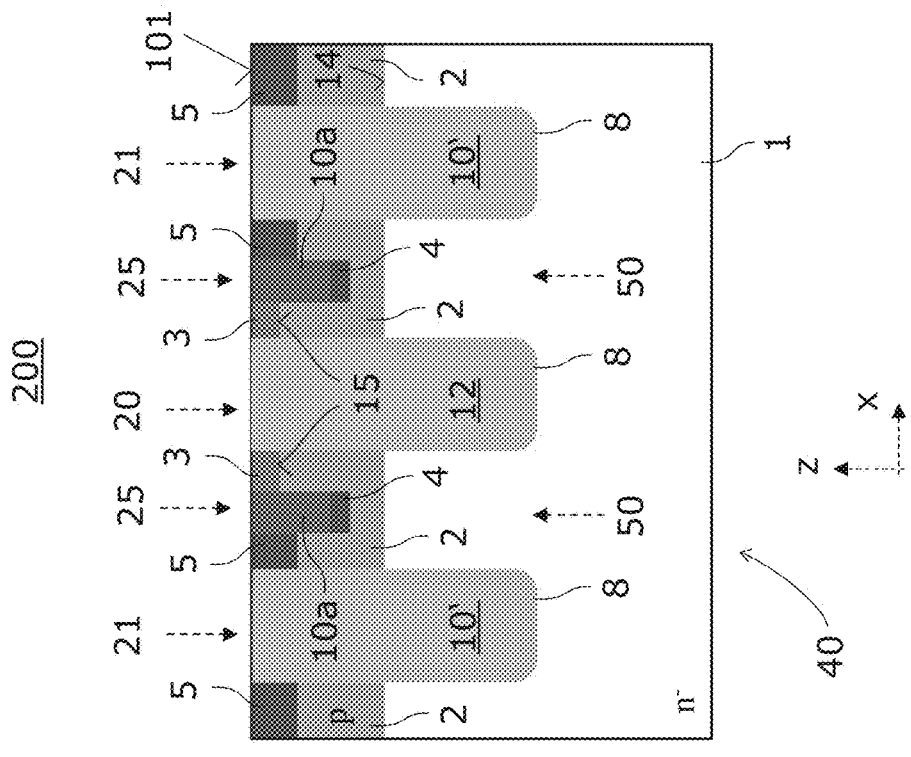
FIG. 1A illustrates a vertical cross-section through a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal side of a semiconductor substrate or body. This can be for instance the surface of a wafer or a die.

The term "vertical" as used in this specification intends to describe an orientation which is substantially arranged perpendicular to the first side, i.e. parallel to the normal direction of the first surface of the semiconductor substrate or body. Likewise, the term "horizontal" as used in this specification intends to describe an orientation which is substantially arranged parallel to the first side.

In this specification, a second side of a semiconductor substrate of semiconductor body is considered to be formed by the lower or backside side or surface while the first side is considered to be formed by the upper, front or main side or surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices, in particular to bipolar semiconductor devices which are controlled by field-effect such as IGBTs and particularly to power IGBTs. and manufacturing methods therefor. Within this specification the terms "semiconductor device" and "semiconductor component" are used synonymously. The semiconductor device is typically a vertical IGBT with an emitter metallization arranged on a first side, a collector metallization arranged on a second side opposite to the first side, and one or more insulated gate electrodes arranged next to the first side for carrying and/or controlling a load current between the emitter metallization arranged and the collector metallization. Typically, the IGBT is a power semiconductor device having an active area with a plurality of IGBT-cells for carrying and/or controlling the load current. Furthermore, the power semiconductor device has typically a peripheral area with at least one edge-termination structure at least partially surrounding the active area when seen from above.

Typically, the gate electrode(s) are implemented as trench-gate electrode(s), i.e. as a gate electrode(s) which are arranged in a trench extending from the main surface into the semiconductor substrate or body.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V, more typically more than about 100 V or even 500 V. Typically, power semiconductor devices are intended for a power of at least about 100 W. Within this specification the terms "power semiconductor device" and "power semiconductor component" are used synonymously.

The terms "substantially intrinsic semiconductor material" and "substantially intrinsic semiconductor region" as used in this specification intend to describe a semiconductor material and a semiconductor region, respectively, having a doping concentration of at most $10^{14}$ cm$^{-3}$, e.g. a doping concentration in a range from about $10^{13}$ cm$^{-3}$ to about $10^{14}$ cm$^{-3}$.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region may be formed and/or controlled between an emitter region of the first conductivity type and a base region or drift region of the first conductivity type arranged between the body region and a collector region or backside hole emitter region of the second conductivity type. Typically, the collector region is in low Ohmic connection, e.g. in low Ohmic contact with a collector electrode (collector metallization). The emitter region and typically also the base region is in low Ohmic connection with an emitter electrode (emitter metallization).

In the context of the present specification, the term "in Ohmic connection" intends to describe that there is an Ohmic current path, e.g. a low-Ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact" intends to describe that two elements or portions of a semiconductor device are in direct mechanical contact and in Ohmic connection.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the base region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. In the context of the present specification, a semiconductor region or layer is typically a monocrystalline semiconductor region or layer, if not stated otherwise. If the semiconductor body comprises a wide band-gap semiconductor material, i.e. a semiconductor material with a band-gap above 1 eV such as silicon carbide (SiC) or gallium nitride (GaN) which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1A, a first embodiment of a semiconductor device 100 is explained. FIG. 1 illustrates a vertical cross-section through a semiconductor body 40 of the semiconductor device 100. The semiconductor body 40 extends to a first side 101, typically a flat surface facing a vertical direction z.

In the exemplary embodiment, the semiconductor body 40 includes an n-type base region 1 arranged below the first side 101 and two adjacent semiconductor mesas 50 which are separated from each other by an insulated trench gate electrode structure 8, 12 formed in a trench 20 extending from the first side 101 partly into the base region 1. The trench gate electrode structure 8, 12 has a gate electrode 12 and a dielectric layer 8 separating the gate electrode 12 from the semiconductor body 40.

Further, each of the two mesas 50 are formed between the trench 20 with the gate electrode 12, which is in the following also referred to as first trench 20, and a respective further trench 21, which are in the following also referred to as second trenches 21.

As illustrated in FIG. 1A, the second trenches 21 typically also include an electrode 10' and the dielectric layer 8 which is arranged between the electrode 10' and the semiconductor body 40.

Typically, the electrodes 10' form field electrodes. As such the electrodes 10' are typically also insulated from the semiconductor body 40, but may not be in Ohmic connection with the gate electrode 12. The electrodes 10' may be floating or in Ohmic connection with a metallisation arranged on the first side 101, typically an emitter metallization.

Therefore, the electrodes 10' are typically not used for current switching. Accordingly, the first trenches 20 and the second trenches 21 are also in the following referred to as gate trenches 20 and inactive trenches 21, respectively.

As illustrated in FIG. 1A, each of the mesas 50 at the first trench 20 has only one emitter region 3.

Typically, there is no emitter region at the dielectric layer 8 of the inactive trenches 21.

The first and second trenches 20, 21 may be of the same shape in the vertical cross-section and/or when seen from above.

Likewise, the electrodes 10' and the gate electrode 12 may be of the same shape in the vertical cross-section and/or when seen from above.

In the vertical cross-section, the electrodes 10', the gate electrode 12 as well as the trenches 20, 21 may have substantially vertically orientated sidewalls.

When seen from above, the electrodes 10', the gate electrode 12 as well as the trenches 20, 21 are typically stripe shaped.

As illustrated in FIG. 1A, the first and second trenches 20, 21 extend through a p-type body layer 2, which forms the first pn-junction 14 with the base region 2, partially into the base region 1. Accordingly, the body layer 2 is, at least in the vertical cross-section, separated by the first and second trenches 20, 21 into separate body regions 2.

In other embodiments (not shown in FIG. 1A and the following figures), the doping relations are reversed.

At each side of the first trench 20, a typically n+-type emitter region 3 is arranged at a respective upper portion of the dielectric layer 80. Each emitter region 3 forms a respective second pn-junction 15 with a body region 2. Accordingly, a channel region may be formed in the body regions 2 along the dielectric layer 8 at both sides of the gate trench 20 by appropriately biasing the gate electrode 12 with respect to the body regions 2.

The emitter regions 3 may extend to the first side 101.

In the exemplary embodiment, each of the mesas 50 at the first trench 20 has an emitter contact 10a which extends from the first side 102, along the respective emitter region 3 and to a p-type body contact region 4 buried in the respective body region 2. Accordingly, in Ohmic contact is formed between the emitter contact 10a and the emitter region 3 and the body contact region 4 in each of the two mesas 50 at the first trench 20. In the following, the body contact region 4 is also referred to as contact region.

As illustrated in FIG. 1A, the emitter contacts 10a may be arranged in respective contact trenches 25 extending deeper into the body layer 2 than the two emitter regions 3, but typically not to the first pn-junction 14. In the following, the contact trenches 25 are also referred to as shallow trenches, and the first and second trenches 20, 21 are also referred to as deep trenches 20, 21.

The emitter contacts 10a and the contact trenches 25, respectively, may, in the vertical cross-section, be substantially centered with respect to their mesa 50.

Further, the emitter contacts 10a are typically formed by a highly conductive material such as highly doped poly-Silicon (poly-Si), a silicide, a metal or a combination thereof.

The body contact regions 4 have a higher doping concentration than the adjoining body region 2. Due to the body contact regions 4, the body region 2 may be kept at emitter potential during device operation. Accordingly, a latch-up may be avoided. Therefore, the body contact regions 4 are in the following also referred to as anti-latch up regions 4.

As illustrated in FIG. 1A, the body contact regions 4 are typically spaced apart from the corresponding emitter region 3 in the respective mesa 50.

According to an embodiment, each of the two mesas 50 at the gate trench 20 include a p-type latch-up-safety region 5 which is in Ohmic contact with the emitter contact 10a and the body region 2, and may be arranged between body region 2 and the first side 101.

The latch-up-safety regions 5 have a higher doping concentration than the adjoining body region 2 and may extend to the first side 101.

The emitter region 3, the latch-up-safety regions 5, the body contact regions 4 and the emitter contacts 10a are typically also substantially stripe-shaped when seen from above.

The latch-up-safety regions 5 are typically highly doped semiconductor regions. Typically, the doping concentration of the latch-up-safety regions 5 is higher than about $10^{18}/cm^{-3}$, more typically higher than about $5*10^{18}/cm^{-3}$.

However, this may depend on the area of the latch-up-safety region(s) 5 in the vertical cross-section.

The doping concentration of the latch-up-safety regions 5 may substantially correspond to the doping concentration of the body contact regions 4 or may even be higher than the doping concentration of the body contact regions 4.

The latch-up-safety regions 5 may provide a low Ohmic current path for holes to the adjoining emitter contact 10a during switching-off and in a blocking mode of the semiconductor device 100, respectively, in particular during a so-called overcurrent turn-off, when the emitter contact 10a is not formed in all cross-sections, e.g. due to a manufacturing failure. Accordingly, the risk of a latch-up can be reduced. As this is explained in more detail below with respect to FIG. 5A to FIG. 5C.

Figure 1B:
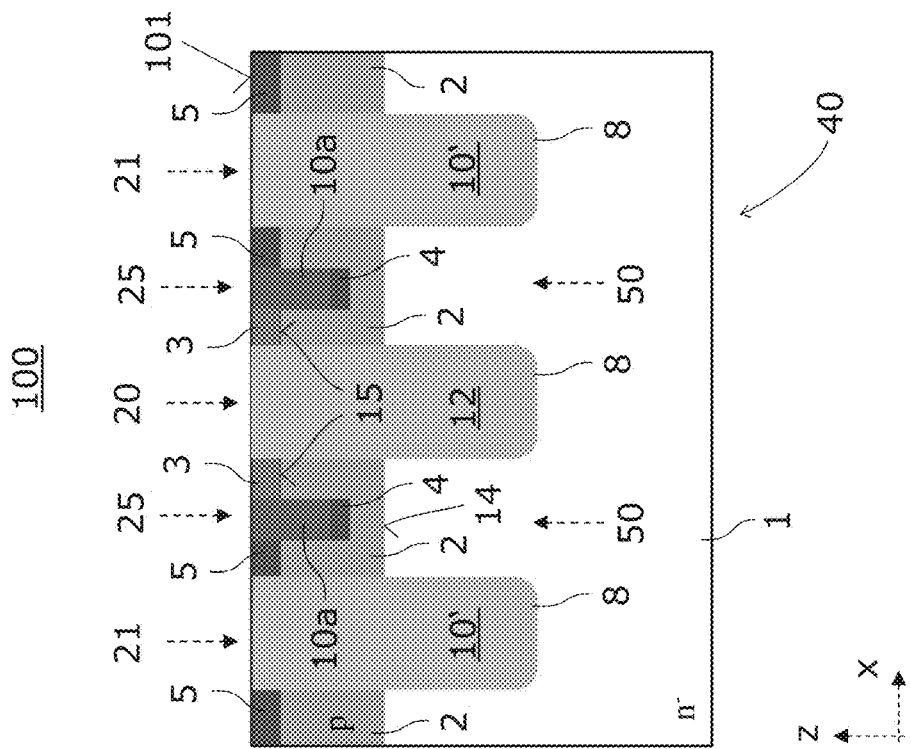
FIG. 1B illustrates a vertical cross-section through a semiconductor device according to an embodiment.

As illustrated in FIG. 1B showing a cross-section through a similar semiconductor device 200, a vertical extension of the latch-up-safety regions 5 may be larger than a vertical extension of the body contact regions 4 and/or a vertical extension of the emitter regions 3. Accordingly, the resistivity of latch-up-safety regions 5 may be particularly low.

Figure 2:
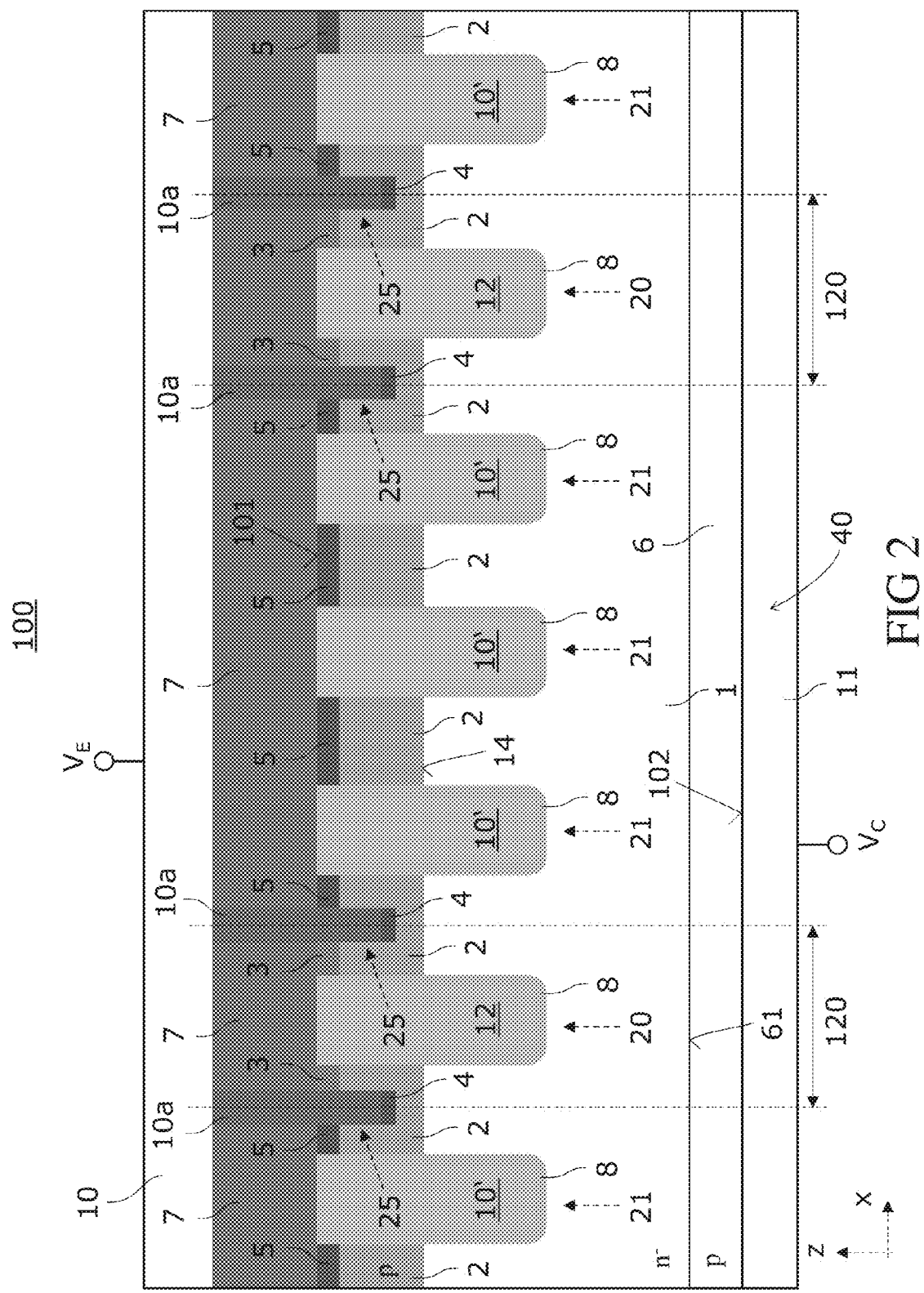
FIG. 2 illustrates a larger section of the semiconductor device illustrated in FIG. 1A according to an embodiment.

FIG. 2 is a typical larger section of the semiconductor device 100 illustrated in FIG. 1A and shows to active cells 120. Each active cell 120 includes two mesas which are separated from each other by a gate trench 20. The definition of the active cells 120 is somewhat literary as the on state current broadens below the body contact regions 4.

Typically, FIG. 2 illustrates a portion of an active area that may be surrounded by a peripheral area when seen from above. The peripheral area may include one or more edge termination structures.

In a horizontal direction (x) parallel to the first side 101, the semiconductor body 40 is delimited by an edge, for example a sawing edge.

In the exemplary embodiment, three inactive trenches 21 are arranged between the two gate trenches 20. This is however only an example. The active area may include a plurality of active cells 120. Further, there may be more or less, for example only one inactive trench 21 between adjacent active trenches 20.

Mesas, which are arranged between and formed between, respectively, inactive trenches 21, may, due to manufacturing, also have a latch-up-safety region 5.

Further, the body regions of the mesas, which are arranged between and formed between, respectively, inactive trenches 21, may be floating as shown in FIG. 2 or in Ohmic connection with the emitter metallization 10 or the gate electrodes 12.

A third pn-junction 61 is arranged vertically below the first pn-junction 14.

In the exemplary embodiment, the pn-junction 61 is formed between the base region 1 and a typically highly doped p-type collector region (backside hole emitter region) 6 in Ohmic contact with a collector metallisation 11 formed at a second side 102 of the semiconductor body 40.

In other embodiments, an n-type field-stop region 1 having a higher doping concentration than the base region may be arranged between the base region and the collector region 6.

On the first side 101, an emitter electrode 10 in contact with emitter contact 10a is arranged. Accordingly, the semiconductor device 100 may be operated as in IGBT having active IGBT cells 120.

The emitter electrode 10 is typically spaced apart from the first side 101 by an interlayer dielectric 7. The dielectric layers 8 and the interlayer dielectric 7 may be made of any suitable dielectric material such as silicon oxide ($SiO_2$), silicon nitride ($Si_3N_4$) and silicon oxynitride ($SiO_xN_y$), TEOS (TetraEthylOrthoSilicat), USG (Undoped Silicate Glass), an HDP-oxide (High Density Plasma-oxide) or a doped oxide, for example PSG (PhosphoSilicate Glass), BPSG (BoroPhosphoSilicate) or BSG (BoroSilicate Glass).

Further, the interlayer dielectric 7 may be formed by different dielectric layers.

Typically, the dielectric layers 8 are made of $SiO_2$ or $Si_3N_4$, more typically by thermal $SiO_2$.

The electrodes 10' of the inactive trenches 21 may be, for example in another cross-section, in Ohmic connection with the emitter metallisation 10 via first through contacts extending from the emitter metallisation 10 through the interlayer dielectric 7 to the electrodes 10' typically forming field electrodes.

However, some or all of the electrodes 10' may also be floating electrodes.

Likewise, the gate electrodes 12 may be in Ohmic connection with a gate metallisation (not shown) arranged on the first side 101, for example via second through contacts arranged in another cross-section and extending from the gate metallisation through the interlayer dielectric 7 to the gate electrodes 12.

Further, some or all of the electrodes 10' may be in Ohmic connection with the gate electrodes 12.

Even further, the semiconductor device 100 may be sealed on the emitter metallization 10 and the first side 101, respectively, except for contact pads, by a cover layer (not shown in FIG. 2) of e.g. polyimide.

Figure 3:
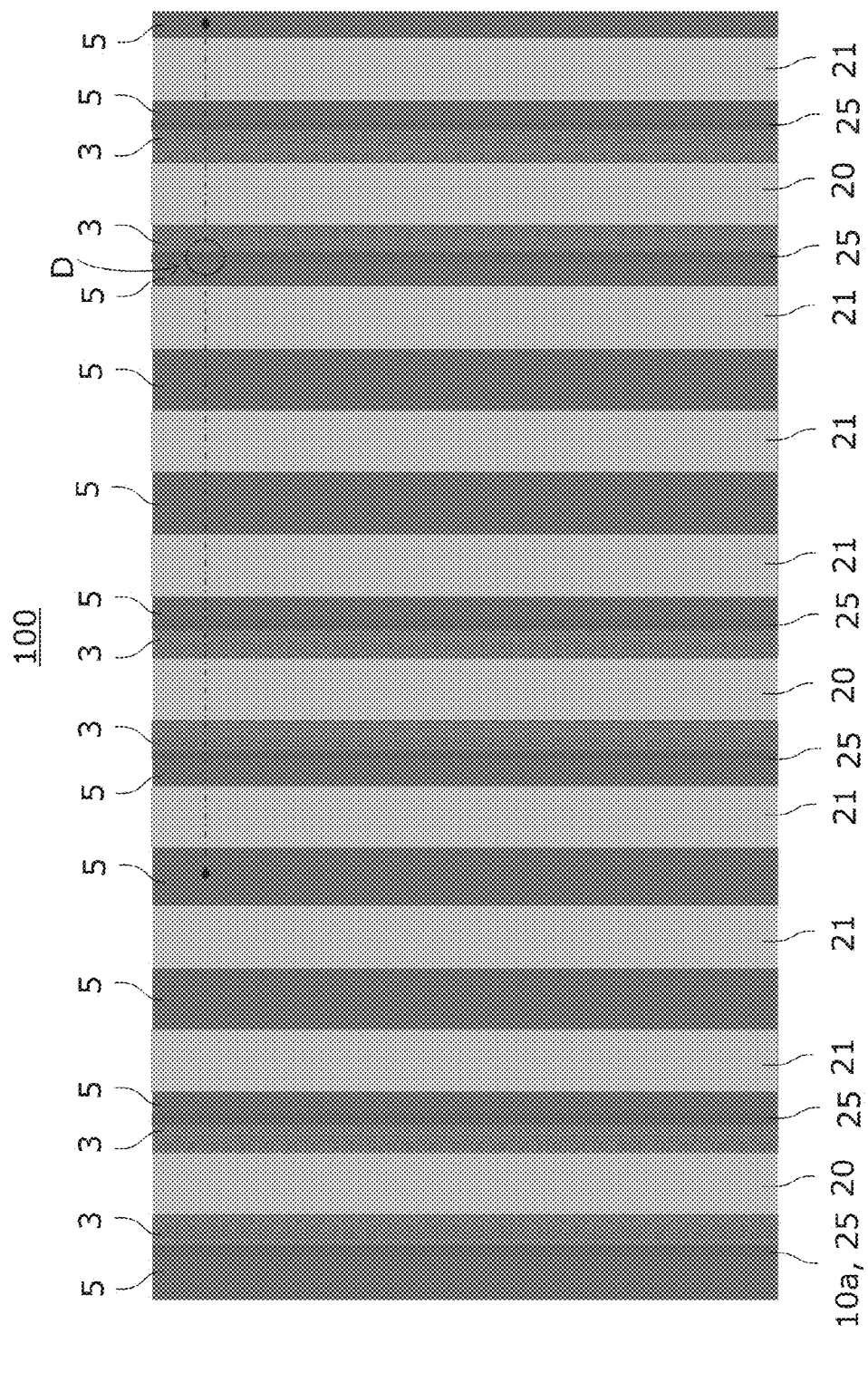
FIG. 3 illustrates a top view of the semiconductor device illustrated in FIG. 2 according to an embodiment.

FIG. 3 illustrates a top view and layout, respectively, of the semiconductor device 100 shown in FIG. 2. FIG. 2 may correspond to a vertical cross-section along the dashed dotted line in FIG. 3. FIG. 3 may also correspond to a horizontal cross-section through the semiconductor body 40 of the semiconductor device 100 next to the first side 101. For sake of clarity, the dielectric regions (8) are however not shown in FIG. 3.

As can be seen from FIG. 3, the first and second trenches 20, 21, the contact trenches 25, the gate electrodes 12, the latch-up-safety regions 5, the emitter regions 3, and the emitter contacts 10a may be formed as parallel stripes when seen from above.

In the exemplary embodiment, each gate trench 20 adjoins two emitter regions 3 which are spaced apart from each other by the gate trench 20 and thus by the gate electrode (12) and the dielectric layer (8) of the gate trench 20.

Figure 4:
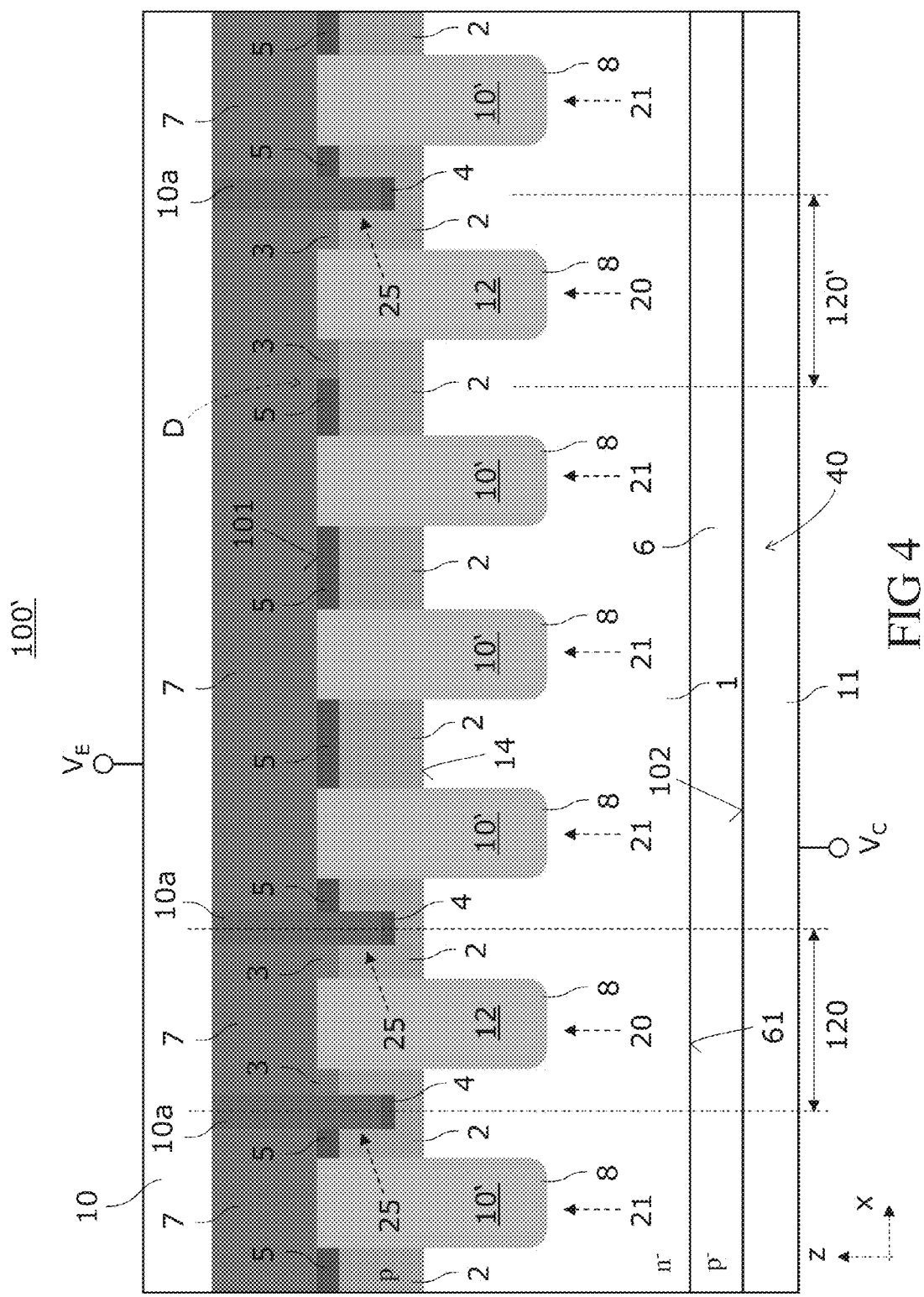
FIG. 4 illustrates a vertical cross-section through a semiconductor device according to an embodiment.

FIG. 4 illustrates a cross-section through a semiconductor device 100' which is similar to the semiconductor device 100 explained above with regard to FIGS. 1A, 2 and 3. FIG. 4 typically corresponds to a vertical cross-section along the dashed dotted line in FIG. 3, marked with a broken contact trench 25 due to a manufacturing failure in the region D.

Accordingly, neither an emitter contact 10a nor a body contact region 4 is formed in the left mesa of the right IGBT-cell 120'. The left mesa of the right IGBT-cell 120' may still substantially contribute to switching the current between the emitter electrode 10 and the collector electrode 11.

Due to the latch-up-safety region 5, the left mesa of the IGBT-cell 120' of IGBT 100' may nevertheless have a high robustness against latch-up, as an emitter contact of the left mesa of the IGBT-cell 120' is formed in neighboring cross-sections. This is explained in more detail in the following.

Figure 5B:
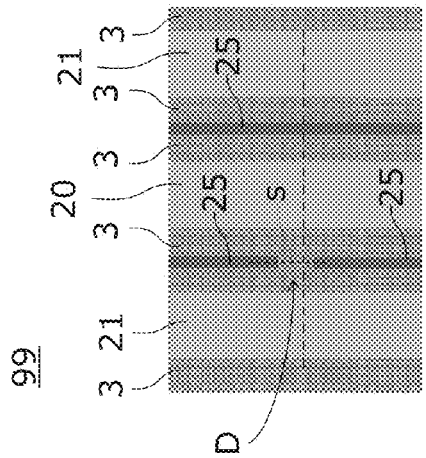
FIG. 5B illustrates a top view of the semiconductor device illustrated in FIG. 5A.
Figure 5C:
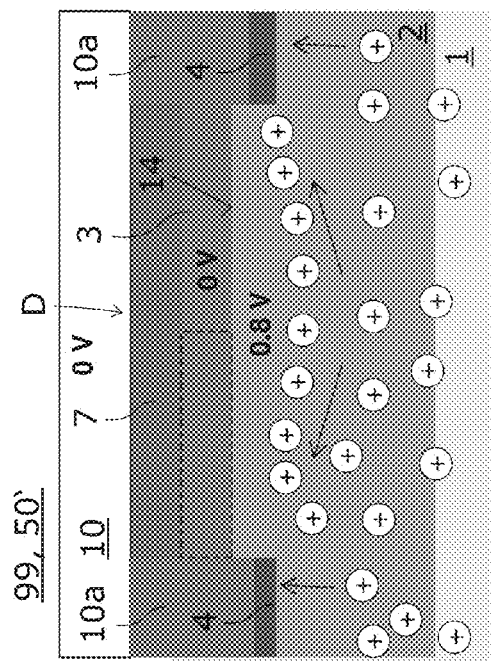
FIG. 5C illustrates a further vertical cross-section through the semiconductor device illustrated in FIG. 5A.
Figure 5A:
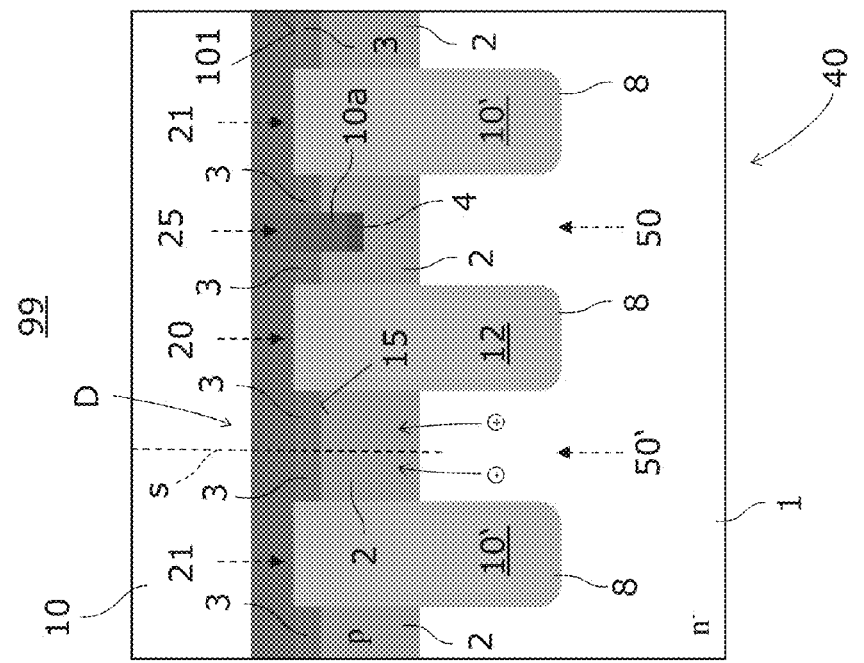
FIG. 5A illustrates a vertical cross-section through a semiconductor device.

FIG. 5A illustrates a vertical section of an IGBT 99. The IGBT 99 is similar to the semiconductor device 100 explained above with regard to FIGS. 1A, 2 and 3. However, there are no latch-up-safety regions in the mesas 50, 50' of the IGBT 99. FIG. 5A typically corresponds to a vertical cross-section along the dashed dotted line in FIG. 5B showing the IGBT 99 in top view and a horizontal cross-section through the semiconductor body 40 next to the first side 101, respectively. FIG. 5C shows a further vertical section of the IGBT 99 along line s shown in FIG. 5A, 5B.

As can be seen in FIG. 5A, 5B, the contact trench 25 is broken in the region D of the left mesa 50'. Accordingly, neither a body contact nor an emitter contact is formed in the mesa 50' left of the gate trench 20. The unwanted gap in the contact trench 25 in the region D may be due to a random manufacturing defect. Such a defect may be caused by a small particle partly shadowing a stripe-shaped hole in a mask for etching the contact trenches 25.

When the IGBT 99 is switched off, holes drawn as encircled plus signs float outwards in the emitter electrode 10 and are, in the mesa 50', collected in the body region 2 in front of the pn-junction 14 as illustrated in FIG. 5C. The hole current, which is due to the holes arranged between the two body contact regions 4 shown in FIG. 5C, has a vertical component. Due to the resistivity of the body region 2, there is a corresponding voltage drop along the current paths. Depending on the resistivity of the body region 2 and the length of the gap in the region D, a voltage drop between the emitter region 3 and the body region 2 may exceed a threshold voltage of the body diode formed between the body region 2 and base region 1 of for example about 0.7 V for silicon. In this event, a parasitic bipolar transistor may ignite (latch-up). This may result in an uncontrolled current, which may even destroy the device 99.

Latch-up may be avoided by a latch-up-safety region as explained above with regard to FIG. 1A to FIG. 4.

In FIG. 5C, the dashed rectangle indicates a suitable region for a latch-up-safety region reducing the hole current pass and thus a voltage drop during switching off.

Accordingly, an increased ruggedness for the defect size region D may be provided by latch-up-safety regions without any side-effect on the channel width.

The latch-up-safety regions may also be used to increase ruggedness of devices, in particular IGBTs, without a separate body contact region as each latch-up-safety region may also provide a typically low-Ohmic connection between the body region and the emitter contact of a mesa. This is explained in the following with regard to FIG. 6A and FIG. 6B.

FIG. 6A illustrates a vertical section of an IGBT 300. The IGBT 300 is similar to the semiconductor device 100 explained above with regard to FIGS. 1A, 2 and 3. However, none of the mesas 50 has a separate body contact region. Instead, the body region 2 of each of the two mesas 50 is in Ohmic contact with the respect emitter contact 10a via the latch-up-safety region 5 arranged therebetween.

Accordingly, the latch-up-safety region 5 can also function as body contacting regions.

In the exemplary embodiment, each of the emitter contacts 10a is directly arranged on the first side 101 and overlaps with the emitter region 3 and the latch-up-safety region 5 of the respective mesa 50.

As illustrated in FIG. 6B showing a cross-section through an IGBT 400, the vertical extension of the latch-up-safety regions 5 may be larger than the vertical extension of the emitter regions 3. Accordingly, the resistivity of the latch-up-safety regions 5 may be particularly low.

Figure 7:
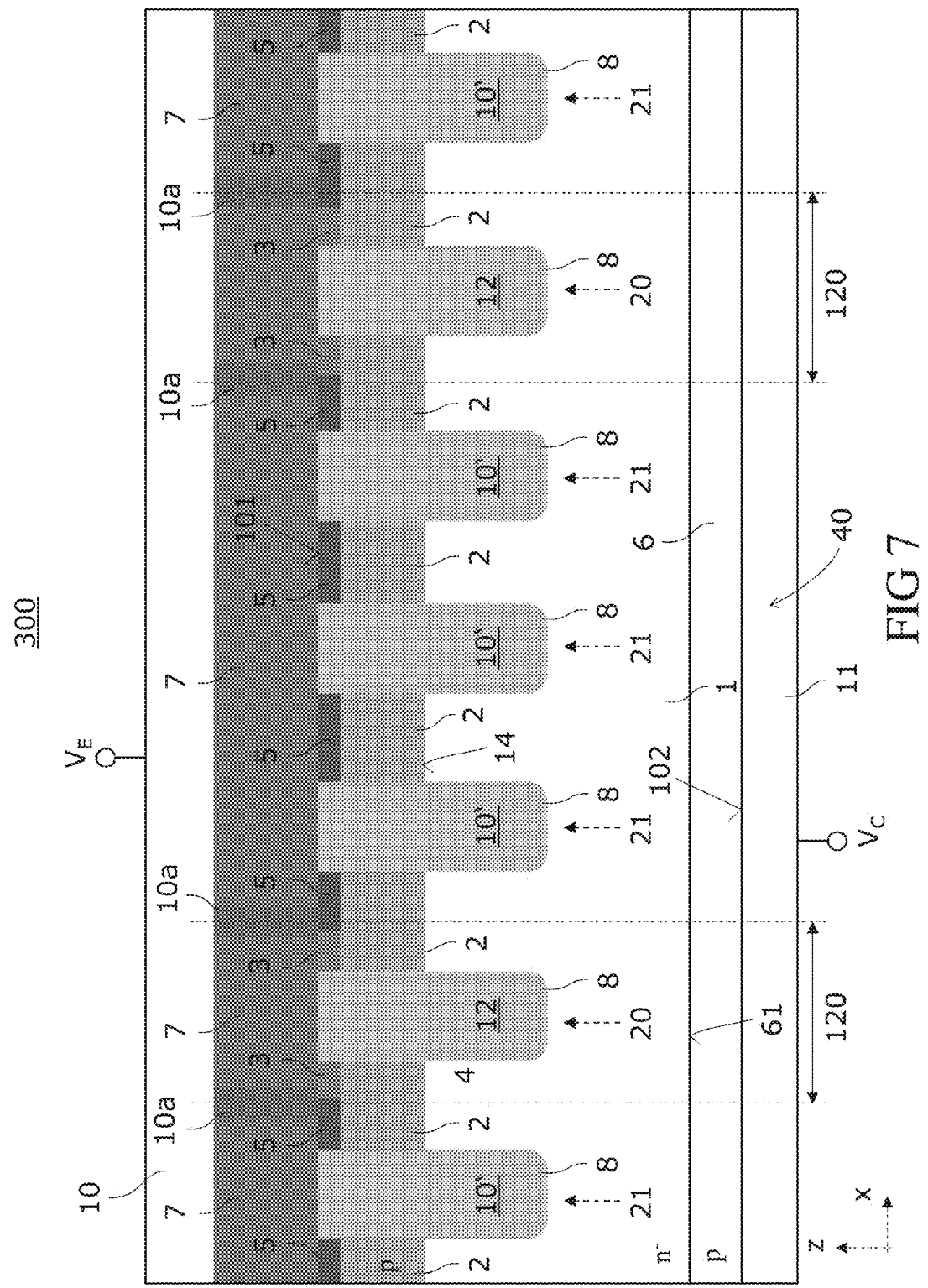
FIG. 7 illustrates a vertical cross-section through a semiconductor device according to an embodiment.
Figure 8:
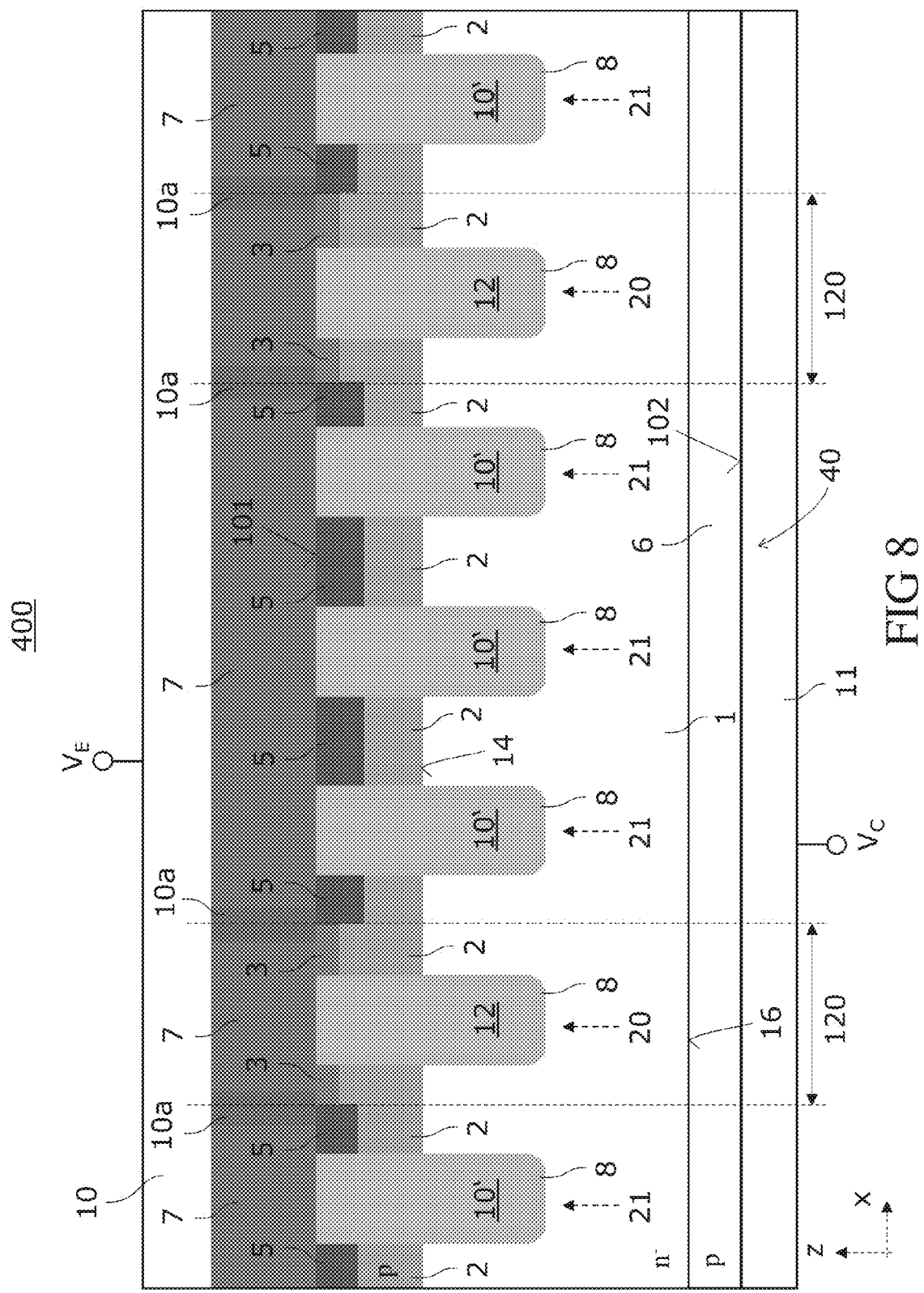
FIG. 8 illustrates a vertical cross-section through a semiconductor device according to an embodiment.

FIGS. 7 and 8 show respective typical larger sections with two exemplary active cells 120 of the IGBTs 300 and 400, respectively, explained with regard to FIG. 6A and FIG. 6B.

Figure 9:
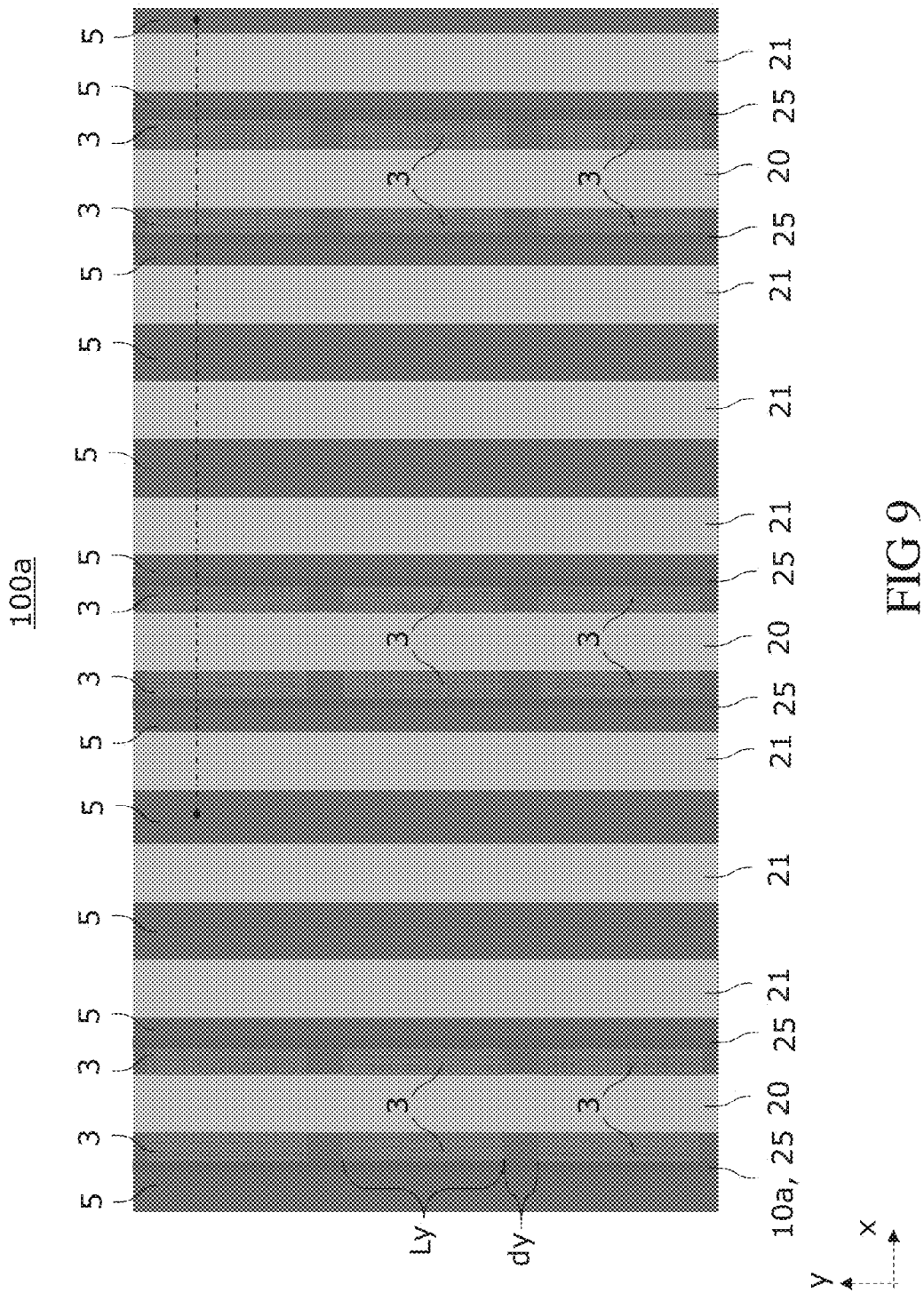
FIG. 9 illustrates a top view of the semiconductor device according to an embodiment.

FIG. 9 illustrates a top view and layout, respectively, of a semiconductor device 100a. The semiconductor device 100a is similar to the semiconductor device 100 explained above with regard to FIG. 1A to FIG. 3 and may also be operated as an IGBT. FIG. 2 as well as FIG. 7 and FIG. 8 may correspond to a vertical section along the dashed dotted line in FIG. 9.

However, the emitter regions 3 at the gate trenches 20 are interrupted periodically in an elongation direction y of the gate trenches 20 in top view, in order to combine the advantages of the latch-up-safety regions 5 and the distance reduction over which the latch-up voltage can be built.

As illustrated in FIG. 9, each gate trench 20 may adjoin several (pairs of) emitter regions 3 when seen from above. Accordingly, each gate electrode (12) arranged in a gate trench 20 may be separated by a respective dielectric layer (8) from more than two emitter regions 3 when seen from above.

The length Ly of the emitter regions 3 in y-direction and the distance dy in y-direction between adjacent emitter regions 3 at the gate trench may be chosen depending on the application, in particular depending on the short circuit ruggedness.

For example, Ly and/or dy may be in a range from about 100 nm and about 10 μm or even more. This may depend on the application requirements.

Figure 10:
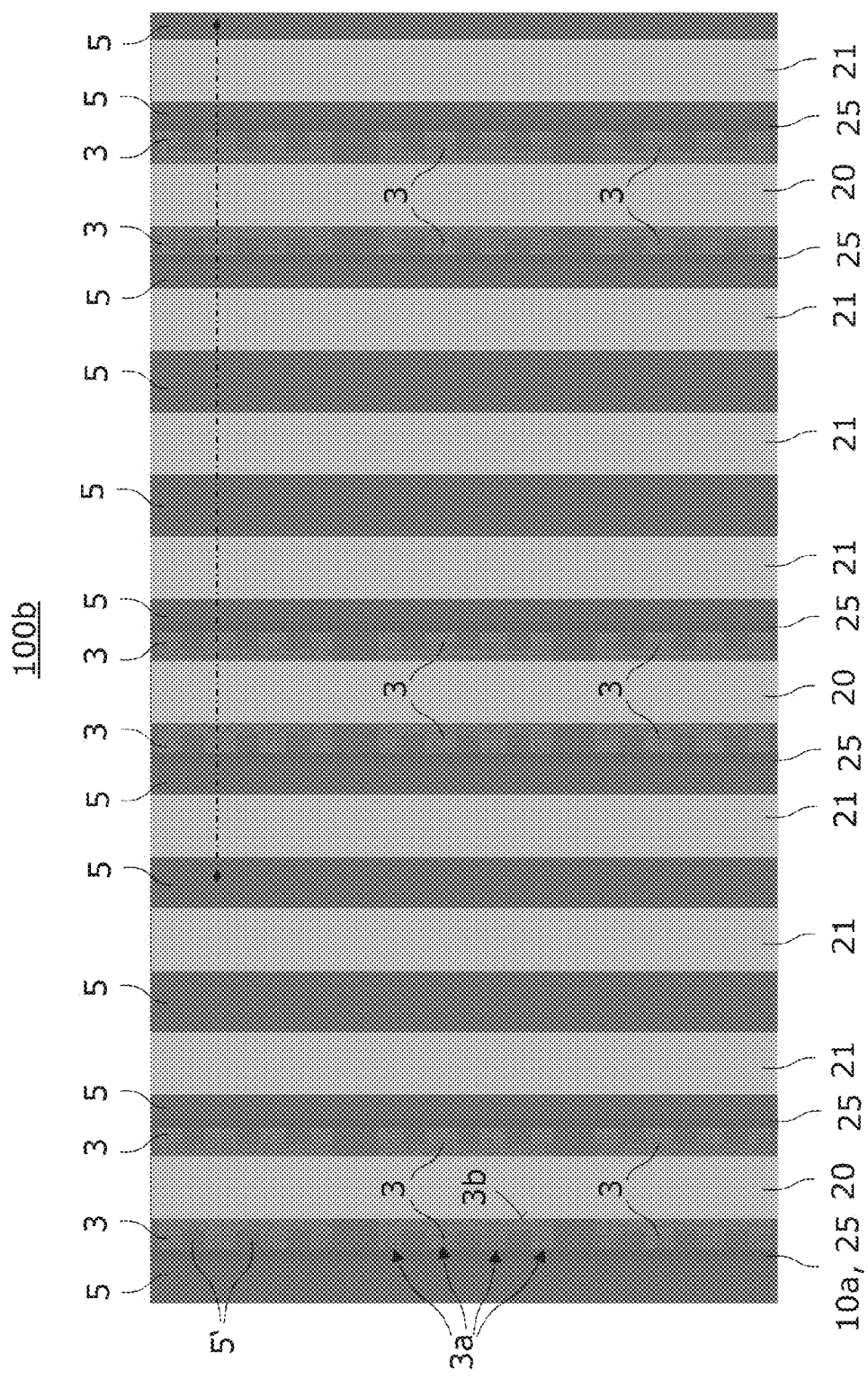
FIG. 10 illustrates a top view of the semiconductor device according to an embodiment.

FIG. 10 illustrates a top view and layout, respectively, of a semiconductor device 100b. The semiconductor device 100b is similar to the semiconductor device 100a explained above with regard to FIG. 6 and may also be operated as an IGBT. FIG. 2 as well as FIG. 7 and FIG. 8 may correspond to a vertical section along the dashed dotted line in FIG. 10.

However, the emitter regions 3 of the semiconductor device 100b are in contact with the emitter contact 10a only via one or more respective finger portions 3a. This has no impact on the channel width of the IGBT 100b, which is mainly defined by the interface 3b between the emitter region 3 and the gate trench 20. The finger portions of an emitter region 3 have a smaller extension in y-direction than a main portion of the respective emitter region 3 at the gate trench 20.

Accordingly, the area of the emitter regions 3 is reduced. This may result in further reducing the latch-up risk during overcurrent switch-off without affecting normal operation modes of the IGBT.

The extensions of the finger portions 3a in x and y direction, the spacing of the finger portions 3a, and the extensions of the main portion of the emitter regions 3 in x and y direction are design parameters.

Figure 11:
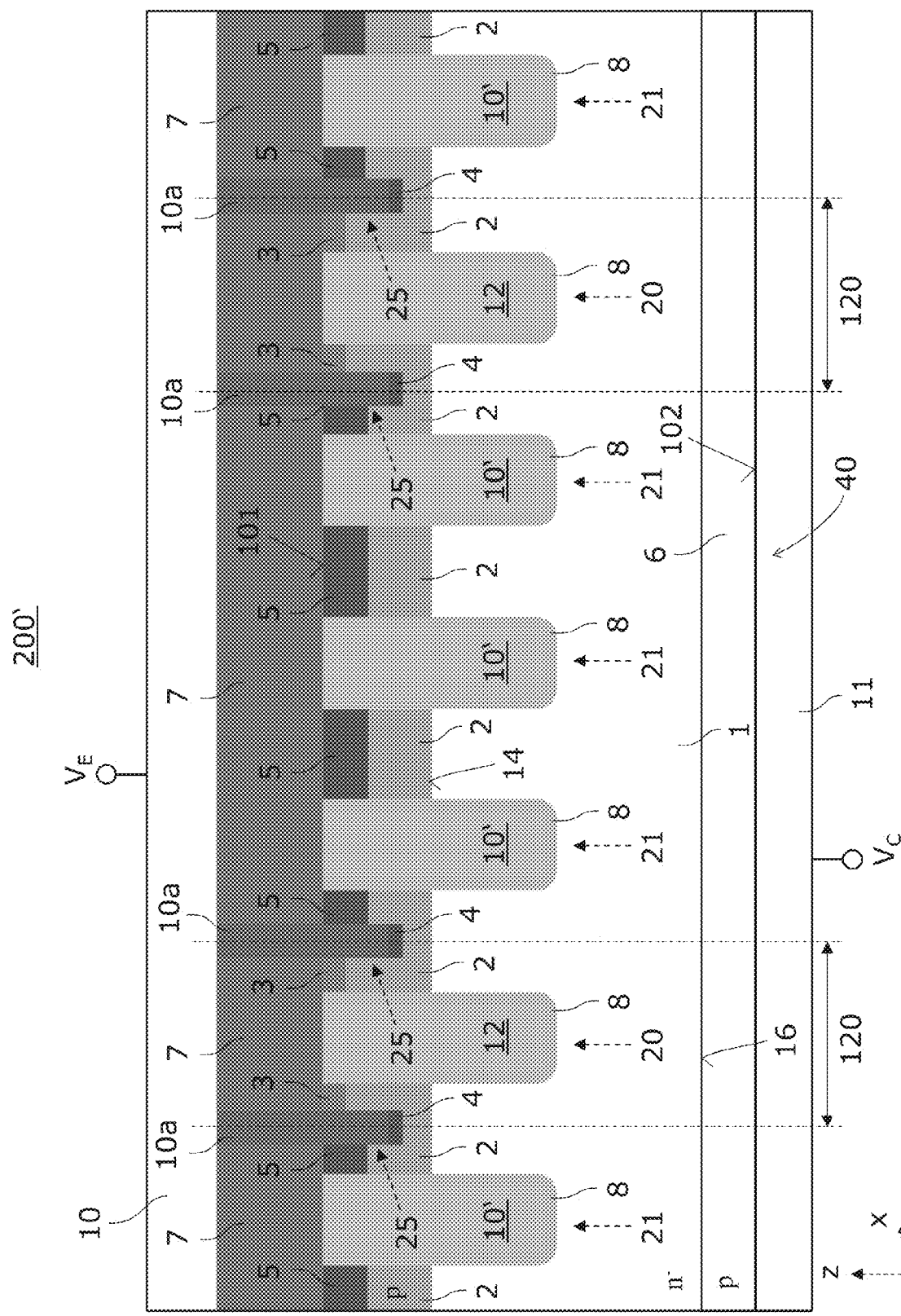
FIG. 11 illustrates a vertical cross-section through a semiconductor device according to an embodiment.

FIG. 11 illustrates a vertical cross-section through a semiconductor device 200'. The semiconductor device 200' is similar to the semiconductor device 100 explained above with regard to FIG. 1A, FIG. 2 and FIG. 3 and may also be operated as an IGBT. However, the latch-up-safety regions 5 extend vertically deeper into the respective body region 2 as explained above with regard to FIG. 1B. Accordingly, the resistivity of the latch-up-safety regions 5 may be further reduced, and thus the ruggedness against latch-up may be further improved. FIG. 1B may correspond to a section of FIG. 11.

With regard to FIG. 12A to 15B method steps of a method for forming a semiconductor device 100 are explained.

In a first process, a wafer 40 having a first side 101, an n-type base layer 1, and a p-type body layer 2 may be provided. The body layer 2 forms a first pn-junction 14 with the base layer 1 and may extend to the first side 101. The first pn-junction 14 may, at least in active device areas, be substantially parallel to the first side 101.

Thereafter, an etching mask 16 having first openings may be formed on the first side 101.

Thereafter, deep trenches 20, 21 may be etched from the first side 101 through the first pn-junction 14 using the etching mask 16.

Figure 12A:
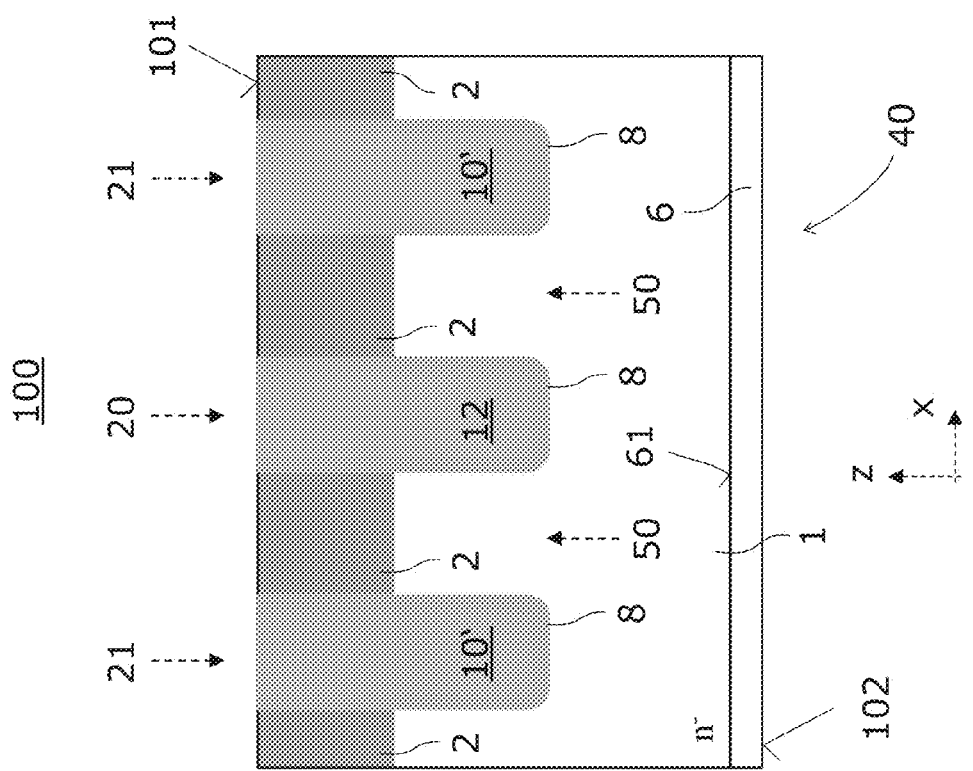

A vertical section of the resulting wafer structure 40 with mesas 50 formed between adjacent deep trenches 20, 21 is shown in FIG. 12A.

Typically, FIG. 12A corresponds to a section of an active area of one of a plurality of semiconductor devices 100 to be manufactured in parallel on wafer level.

As illustrated in FIG. 12A, the provided wafer 40 may have a p-type collector layer 6. The p-type collector layer 6 typically extends to a second side 102 opposite the first side 101.

Further, the p-type collector layer 6 may form a further pn-junction 16 with the base layer 1.

Alternatively, a higher n-doped field-stop region or layer may be arranged between the base layer 1 and the collector layer 6.

The deep trenches 20, 21 may have (substantially) vertically orientated sidewalls.

After forming the deep trenches 20, 21, dielectric layers 8 may be formed at the sidewalls and bottom walls of the deep trenches 20, 21. This may e.g. be achieved by thermal oxidation.

Thereafter, the deep trenches 20, 21 may be filled with a conductive material such as highly p-doped poly-Si to form insulated electrodes 10', 12 in the deep trenches 10, 21. This may include depositing the conductive material from the first side 101 and a planarization process, e.g. chemical mechanical polishing (CMP).

Figure 12B:
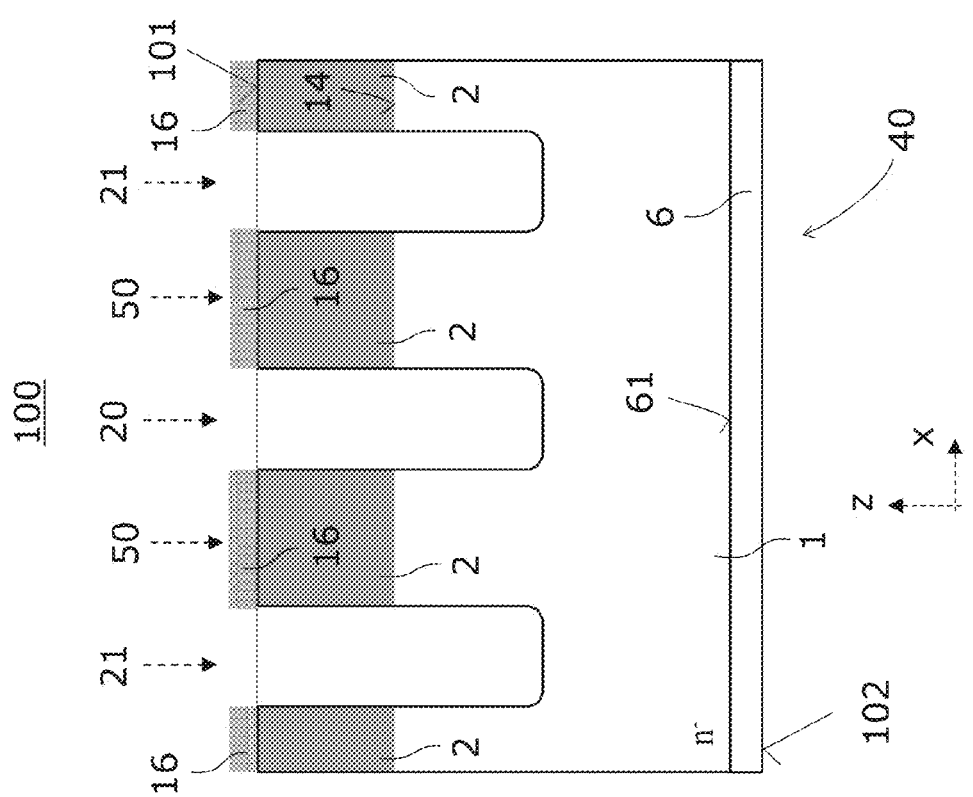

A vertical section of the resulting wafer structure 40 is shown in FIG. 12B after further removing the etching mask 16.

Thereafter, the deep trenches 21, which are designed as inactive trenches, and adjoining mesa portions may be covered by an implantation mask 17 on the first side 101. The implantation marks 17 has second opening(s) exposing first deep trench(es) 20, which are designed as active trenches of the semiconductor device 100 to be manufactured, and adjoining portions of the body layer 2.

Typically, the corresponding second opening(s) and the first deep trench(es) 20 are substantially centered with respect to each other.

Thereafter, n-type dopants may be implanted from the first side 101 into zones 3 of the body layer 2 next to the first side 101 using the implantation mask 17.

A vertical section of the resulting wafer structure 40 is shown in FIG. 13A.

Thereafter, the implantation mask 17 may be removed.

Thereafter, p-type dopants may be implanted from the first side 101 into zones 5 of the body layer 2 next to the first side 101.

A vertical section of the resulting wafer structure 40 is shown in FIG. 13B.

In one embodiment, the p-type dopants are implanted mask-less from the first side 101 with an implantation dose that does not over-dope the n-type dopants in the zones 3.

In another embodiment, a further implantation mask 18 for implanting the p-type dopants may be formed on the first side 101 prior to implanting the p-type dopants.

Typically, the further implantation mask 18 has mask portion(s) 18 substantially overlapping with the second opening(s) of the implantation mask 17.

Using a further implantation mask 18 increases manufacturing time and effort, but also allows higher p-doping and facilitates forming of vertically thicker latch-up-safety regions 5 as illustrated by the dashed rectangles in FIG. 13B. This may result in particularly low Ohmic latch-up-safety regions 5.

After implanting, the n-dopants and p-dopants may be activated by thermal annealing to form the emitter regions 3 and the latch-up-safety regions 5.

Alternatively to implanting, the n-dopants and/or the p-dopants may be outdiffused from respective masks formed at the first side 101, for example from respective doped oxide masks.

FIGS. 14A, 14B illustrates top views of mask layouts that may be used for manufacturing. Shown is an overlay of the openings 16 of the etching mask for forming the deep trenches, the openings 17 of the implantation mask for implanting the n-type dopants, and the openings 19 of a further etching mask for etching contact trenches.

The letters I, and G in the stripe-shaped openings 16 for forming the deep trenches in FIG. 14A correspond to a layout of inactive trenches (I) and gate trenches (G) as illustrated above in FIGS. 2, 4, 7, 8 and 11.

The openings 19 of the further etching mask may partly overlap with adjacent openings 17 of the implantation mask when seen from above.

The implantation mask 17 shown in FIG. 14A has several rectangular openings 17 per opening 16 of the etching mask for forming the deep trenches, and may be used to manufacture a semiconductor device 100a as explained above with regard to FIG. 9.

Each of the openings 17 of the implantation mask may overlap with (only) one opening 16 of the etching mask for forming the deep trenches, more particular with an opening 16 for a gate trench.

Alternatively, one elongated rectangular opening 17 per opening 16 of the etching mask for forming the deep trenches may be used. This is indicated in FIG. 14A by the two dashed rectangles each surrounding exemplary openings 17.

As illustrated in FIG. 14B, the openings 17 may also be formed as a rectangle with rectangular side portions (four in the exemplary embodiment). Such a design may be used for manufacture a semiconductor device 100b' similar to the semiconductor device 100b as explained above with regard to FIG. 9.

After forming the emitter regions 3 and the latch-up-safety regions 5, an interlayer dielectric 7 may be formed on the first side 101.

The interlayer dielectric 7 may include more than one interlayer dielectric layer. Further, the interlayer dielectric 7 may be formed on the first side 101 by depositing dielectric material(s).

Thereafter, contact trenches 25 may be formed through the interlayer dielectric 7, the emitter regions 3 and the latch-up-safety regions 5, and partially into the body regions 2 formed by portions of the body layer 2 in adjacent mesas 50 separated from each other by the gate trench 20.

As shown in FIG. 15A illustrating a vertical section of the resulting wafer structure 40, the contact trenches 25 may be substantially centered with respect to the contacted mesa 50.

Typically, the contact trenches 25 are formed by etching using a mask 19 as explained above with regard to FIG. 14A, 14B, and formed on the interlayer dielectric 7.

Thereafter, a body contact region 4 may be formed at the bottom of each contact trench 25. This may include implanting further p-type dopants from the first side 101 and a further annealing process.

Thereafter, the contact trenches 25 may be filled with a conductive material such as poly-Si, or a metal to form an emitter contact 10a in each contact trench 25.

This may be achieved by depositing and an optional planarization process, e.g. by CMP.

An upper part of the deposited conductive material may form a metallization on the interlayer dielectric 7. Typically, the metallization is further structured to form an emitter metallization 10 and a gate metallization separated from the emitter metallization 10.

A vertical section of the resulting wafer structure 40 is shown in FIG. 15B.

Thereafter, the wafer structure 40 may be sealed on the emitter metallization 10 and the first side 101, respectively, except for contact pads, by a cover layer of e.g. polyimide.

Thereafter, a collector metallization may be formed on the second side 102 in Ohmic contact with the collector layer 6.

Thereafter, the wafer structure 40 may be singulated in individual devices 100. This may e.g. be achieved by sawing.

With regard to FIGS. 16A and 16B method steps of a method for forming a semiconductor device 300 are explained. After first processes as explained above with regard to FIG. 12A to FIG. 14B, contact trenches 25 may be etched through an interlayer dielectric 7, which is formed on the first side 101, and to the emitter regions 3 and the latch-up-safety regions 5 of adjacent mesas 50 separated from each other by the gate trench 20.

As illustrated in FIG. 16A, the contact trenches 25 may only be etched to the first side 101 using an etching mask (19) as explained above with regard to FIGS. 14A and 14B.

Alternately, the contact trenches 25 may be etched into the emitter regions 3 and the latch-up-safety regions 5.

Thereafter, the contact trenches 25 may be filled with a conductive material such as poly-Si, or a metal to form an emitter contact 10a in each contact trench 25.

This may be achieved by depositing and an optional planarization process, e.g. by CMP.

An upper part of the deposited conductive material may form a metallization on the interlayer dielectric 7. Typically, the metallization is further structured to form an emitter metallization 10 and a gate metallization separated from the emitter metallization 10.

A vertical section of the resulting wafer structure 40 is shown in FIG. 16B.

Thereafter, the wafer structure 40 may be sealed on the emitter metallization 10 and the first side 101, respectively, except for contact pads, by a cover layer of e.g. polyimide.

Thereafter, a collector metallization may be formed on the second side 102 in Ohmic contact with the collector layer 6.

Thereafter, the wafer structure 40 may be singulated in individual devices 300. This may e.g. be achieved by sawing.

According to an embodiment of a semiconductor device, the semiconductor device includes a semiconductor body having a first side. The semiconductor body includes a base region of a first conductivity type, and two semiconductor mesas which are separated from each other by an insulated trench gate electrode structure extending from the first side into the base region. The insulated trench gate electrode structure includes a gate electrode and a dielectric layer separating the gate electrode from the semiconductor body. Each of the two semiconductor mesas includes, in a cross-section perpendicular to the first side, a body region of a second conductivity type forming a first pn-junction with the base region, a latch-up-safety region of the second conductivity type arranged between the body region and the first side, and having a higher doping concentration than the body region, and an emitter region of the first conductivity type arranged at the dielectric layer and between the dielectric layer and the latch-up-safety region, and forming a second pn-junction with the body region. At least one of the two semiconductor mesas includes, in the cross-section, a contact region buried in the body region and having a higher doping concentration than the body region. An emitter contact is arranged between the emitter region and the latch-up-safety region, extends from the contact region at least to the first side, and forms with the latch-up-safety region, the contact region, and the emitter region a respective Ohmic contact.

According to an embodiment of a semiconductor device, the semiconductor device includes a semiconductor body having a first side. The semiconductor body includes a base region of a first conductivity type, a semiconductor mesa formed between two trenches each of which extends from the first side into the base region, a body region of a second conductivity type arranged in the semiconductor mesa and forming a first pn-junction with the base region, a body contact region buried in the body region, having a higher electric conductivity than the body region and forming an Ohmic contact with the body region, an emitter region of the first conductivity type forming a second pn-junction with the body region in the semiconductor mesa, and a latch-up-safety region of the second conductivity type arranged between the first pn-junction and the first side and having a higher doping concentration than the body region. An emitter contact is arranged between the emitter region and the latch-up-safety region, and forms with each of the latch-up-safety region, the body contact region, and the emitter region a respective Ohmic contact.

According to an embodiment of method for forming a semiconductor device, the method includes providing a wafer structure having a first side, and including a base layer of a first conductivity type, a body layer of a second conductivity type forming a first pn-junction with the base layer, deep trenches extending from the first side through the first pn-junction. Each of the deep trenches includes a conductive region and a dielectric layer separating the conductive region from the base layer and the body layer. Two emitter regions of the first conductivity type and two latch-up-safety regions of the second conductivity type are formed in the body layer, so that, in a cross-section perpendicular to the first side, a first deep trench of the deep trenches is arranged between the two emitter regions, each of which adjoins the dielectric layer of the first deep trench and is arranged between one of the two latch-up-safety regions and the dielectric layer of the first deep trench. From the first side two contact trenches extending deeper into the body layer than the two emitter regions and the two latch-up-safety regions are formed so that each of the two contact trenches adjoins one of the two emitter regions and one of the two latch-up-safety regions.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body comprising a first side, a base region of a first conductivity type, and two semiconductor mesas separated from each other by an insulated trench gate electrode structure extending from the first side into the base region, and comprising a gate electrode and a dielectric layer separating the gate electrode from the semiconductor body,
   wherein each of the two semiconductor mesas comprises, in a cross-section perpendicular to the first side, a body region of a second conductivity type forming a first pn-junction with the base region, a latch-up-safety region of the second conductivity type arranged between the body region and the first side and having a higher doping concentration than the body region, and an emitter region of the first conductivity type arranged at the dielectric layer and between the dielectric layer and the latch-up-safety region and forming a second pn-junction with the body region,
   wherein at least one of the two semiconductor mesas comprises an emitter contact forming with the latch-up-safety region and the emitter region a respective Ohmic contact in the cross-section,
   wherein a contact region buried in the body region of one of the two semiconductor mesas has a higher doping concentration than the body region and forms a respective Ohmic contact with the emitter contact and the body region.

2. The semiconductor device of claim 1, further comprising an emitter metallization arranged on the first side, wherein the emitter metallization is in contact with the emitter contact, or wherein a portion of the emitter metallization forms the emitter contact.

3. The semiconductor device of claim 1, further comprising at least one of:
   a collector region of the second conductivity type arranged below the base region;
   a field-stop region of the first conductivity type having a higher doping concentration than the base region, and arranged between the base region and the collector region; and
   a collector metallization arranged opposite the emitter metallization and in Ohmic connection with the collector region.

4. The semiconductor device of claim 1, wherein the semiconductor device is a bipolar semiconductor device, and/or wherein the semiconductor device is implemented as an IGBT.

5. The semiconductor device of claim 1, wherein the contact region is of the second conductivity type, and/or wherein the contact region is spaced apart from the latch-up-safety region.

6. The semiconductor device of claim 1, wherein at least one of the gate electrode, the two semiconductor mesas, the latch-up-safety regions, the emitter regions, the contact region, and the emitter contacts is substantially stripe-shaped when seen from above, and/or wherein at least one of the two semiconductor mesas comprises at least two emitter regions when seen from above.

7. The semiconductor device of claim 1, wherein the emitter contact is arranged between the emitter region and the latch-up-safety region, wherein the emitter contact overlaps with the emitter region and the latch-up-safety region when seen from above, and/or wherein the at least one of the two semiconductor mesas includes only one emitter region.

8. The semiconductor device of claim 1, further comprising a latch-up-safety portion which is, when seen from above, surrounded by the emitter region and the emitter contact of the at least one of the two semiconductor mesas.

9. The semiconductor device of claim 1, wherein each of the two semiconductor mesas is formed between the insulated trench gate electrode structure and a respective trench electrode structure comprising an electrode and a dielectric layer which is arranged between the electrode and the semiconductor body, and wherein the electrode is not in Ohmic connection with the gate electrode.

10. A semiconductor device, comprising:
    a semiconductor body comprising a first side, a base region of a first conductivity type, a semiconductor mesa formed between two trenches each of which extends from the first side into the base region, a body region of a second conductivity type arranged in the semiconductor mesa and forming a first pn-junction with the base region, an emitter region of the first conductivity type forming a second pn-junction with the body region in the semiconductor mesa, and a latch-up-safety region of the second conductivity type arranged between the first pn-junction and the first side and comprising a higher doping concentration than the body region;
    an emitter contact forming with each of the latch-up-safety region and the emitter region a respective Ohmic contact; and
    a body contact region buried in the body region, having a higher electric conductivity than the body region and forming an Ohmic contact with the body region and the emitter contact.

11. The semiconductor device of claim 10, further comprising an emitter metallization arranged on the first side, wherein the emitter metallization is in contact with the emitter contact or wherein a portion of the emitter metallization forms the emitter contact.

12. The semiconductor device of claim 10, further comprising at least one of:
    a collector region of the second conductivity type arranged below the base region; and
    a collector metallization arranged opposite the emitter metallization and in Ohmic connection with the collector region.

13. The semiconductor device of claim 10, wherein the body contact region is of the second conductivity type, has a higher doping concentration than the body region and/or is spaced apart from the latch-up-safety region.

14. A method of manufacturing a semiconductor device, the method comprising:
    providing a semiconductor body comprising a first side, a base region of a first conductivity type, and two semiconductor mesas separated from each other by an insulated trench gate electrode structure extending from the first side into the base region, and comprising a gate electrode and a dielectric layer separating the gate electrode from the semiconductor body;
    in each of the two semiconductor mesas comprises, in a cross-section perpendicular to the first side, forming a body region of a second conductivity type forming a first pn-junction with the base region, a latch-up-safety region of the second conductivity type arranged between the body region and the first side and having a higher doping concentration than the body region, and an emitter region of the first conductivity type arranged at the dielectric layer and between the dielectric layer and the latch-up-safety region and forming a second pn-junction with the body region, wherein at least one of the two semiconductor mesas comprises an emitter contact forming with the latch-up-safety region and the emitter region a respective Ohmic contact in the cross-section; and
    forming a contact region buried in the body region of one of the two semiconductor mesas, the contact region having a higher doping concentration than the body region and forming a respective Ohmic contact with the emitter contact and the body region.

15. A method of manufacturing a semiconductor device, the method comprising:
    providing a semiconductor body comprising a first side, a base region of a first conductivity type, a semiconductor mesa formed between two trenches each of which extends from the first side into the base region, a body region of a second conductivity type arranged in the semiconductor mesa and forming a first pn-junction with the base region, an emitter region of the first conductivity type forming a second pn-junction with the body region in the semiconductor mesa, and a latch-up-safety region of the second conductivity type arranged between the first pn-junction and the first side and comprising a higher doping concentration than the body region;
    forming an emitter contact which forms with each of the latch-up-safety region and the emitter region a respective Ohmic contact; and
    forming a body contact region buried in the body region, the body contact region having a higher electric conductivity than the body region and forming an Ohmic contact with the body region and the emitter contact.

* * * * *